(12) United States Patent
Tan et al.

(10) Patent No.: US 9,276,206 B2
(45) Date of Patent: Mar. 1, 2016

(54) SCALABLE AND RELIABLE NON-VOLATILE MEMORY CELL

(71) Applicant: GLOBALFOUNDRIES Singapore Pte. Ltd., Singapore (SG)

(72) Inventors: Shyue Seng Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/210,379

(22) Filed: Mar. 13, 2014

(65) Prior Publication Data

US 2014/0264540 A1   Sep. 18, 2014

Related U.S. Application Data

(60) Provisional application No. 61/786,609, filed on Mar. 15, 2013.

(51) Int. Cl.
| | |
|---|---|
| *H01L 29/788* | (2006.01) |
| *H01L 45/00* | (2006.01) |
| *H01L 27/24* | (2006.01) |
| *H01L 29/423* | (2006.01) |
| *H01L 29/66* | (2006.01) |
| *H01L 27/115* | (2006.01) |

(52) U.S. Cl.
CPC ...... *H01L 45/1226* (2013.01); *H01L 27/11521* (2013.01); *H01L 27/2436* (2013.01); *H01L 29/42328* (2013.01); *H01L 29/66825* (2013.01); *H01L 45/126* (2013.01); *H01L 45/1608* (2013.01); *H01L 45/1691* (2013.01)

(58) Field of Classification Search
CPC ........................ H01L 27/11517; H01L 29/788
USPC .................................. 257/320; 438/266, 267
See application file for complete search history.

(56) References Cited

U.S. PATENT DOCUMENTS

| | | | |
|---|---|---|---|
| 6,355,527 B1 | 3/2002 | Lin et al. | |
| 6,706,592 B2 | 3/2004 | Chern et al. | |
| 6,838,725 B2 | 1/2005 | Lin et al. | |
| 7,668,013 B2 | 2/2010 | Chern et al. | |
| 2014/0264540 A1* | 9/2014 | Tan et al. | 257/320 |

* cited by examiner

*Primary Examiner* — Mark Prenty
(74) *Attorney, Agent, or Firm* — Horizon IP Pte. Ltd.

(57) ABSTRACT

Devices and methods for forming a device are disclosed. The method includes providing a substrate and forming a memory cell pair on the substrate. Each of a memory cell of the memory cell pair includes at least one transistor having first and second gates formed between first and second terminals and a third gate disposed over the second terminal. The first gate serves as an access gate (AG), the second gate serves as a storage gate and the third gate serves as an erase gate (EG). The first cell terminal serves as a bitline terminal and the second cell terminal serves as a source line terminal. The source line terminal is a raised source line terminal and is elevated with respect to the bit line terminal and the source line terminal is common to the memory cell pair.

23 Claims, 24 Drawing Sheets

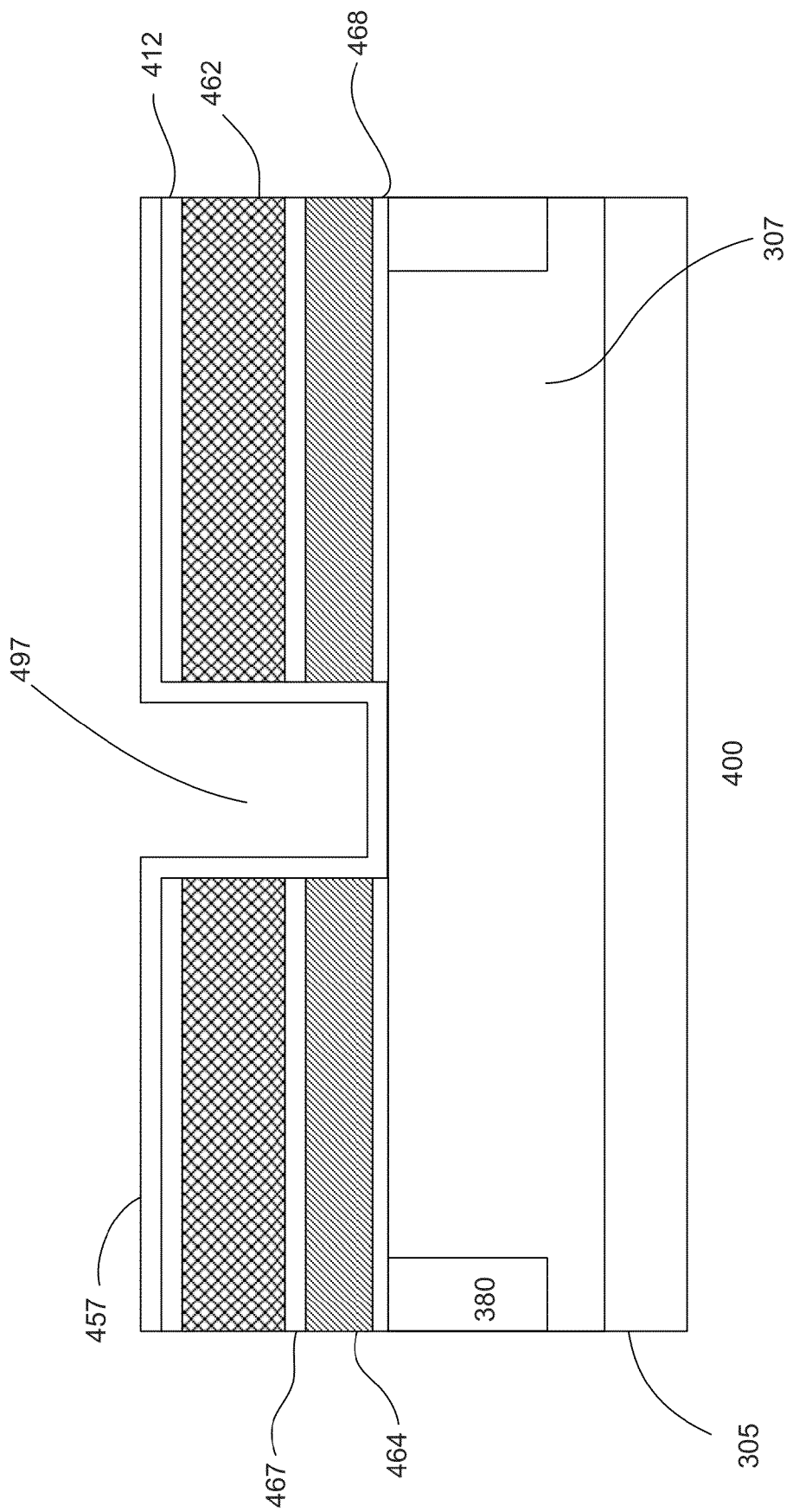

SCALABLE AND RELIABLE NON-VOLATILE MEMORY CELL

CROSS-REFERENCE TO RELATED APPLICATION

This application claims the priority benefit of U.S. Provisional Application Ser. No. 61/786,609, filed on Mar. 15, 2013, which is herein incorporated by reference in its entirety.

BACKGROUND

Split gate non-volatile memory (NVM) circuits have achieved widespread adoptions for code and data storage applications. An important aspect of split gate NVM circuits is their performance, which includes endurance (number of programming or write/erase cycles) and data retention after write/erase cycling. Memory operations, such as programming and erasing, may involve, for example, charging or discharging electrons from a floating gate of the split gate NVM cell. The charging and discharging of electrons may be achieved by Hot Carrier Injection (HCI) or Fowler-Nordheim (FN) tunneling.

Current split-gate NVM cell suffers several limitations, such as scalability issues or program disturbance due to poor punch through immunity. As such, it is desirable to provide a split-gate NVM cell with improved scalability, increased program/erase speed, minimized program disturbance and with improved endurance.

SUMMARY

Embodiments generally relate to semiconductor devices and methods for forming a semiconductor device. In one embodiment, a method for forming a device is disclosed. The method includes providing a substrate and forming a memory cell pair on the substrate. Each of a memory cell of the memory cell pair includes at least one transistor having first and second gates formed between first and second terminals and a third gate disposed over the second terminal. The first gate serves as an access gate (AG), the second gate serves as a storage gate and the third gate serves as an erase gate (EG). The first cell terminal serves as a bitline terminal and the second cell terminal serves as a source line terminal. The source line terminal is a raised source line terminal and is elevated with respect to the bit line terminal and the source line terminal is common to the memory cell pair.

In another embodiment, a device is disclosed. The device includes a substrate and a memory cell pair disposed on the substrate. Each of a memory cell of the memory cell pair includes at least one transistor having first and second gates formed between first and second terminals and a third gate disposed over the second terminal. The first gate serves as an access gate (AG), the second gate serves as a storage gate and the third gate serves as an erase gate (EG). The first cell terminal serves as a bitline terminal and the second cell terminal serves as a source line terminal. The source line terminal is a raised source line terminal and is elevated with respect to the bit line terminal and the source line terminal is common to the memory cell pair.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 4a-4i show cross-sectional views of an embodiment of a process for forming a memory cell.

DETAILED DESCRIPTION

Embodiments generally relate to semiconductor devices. More particularly, some embodiments relate to memory devices, such as non-volatile memory devices. Such memory devices, for example, can be incorporated into standalone memory devices, such as USB or other types of portable storage units, or ICs, such as microcontrollers or System-on-Chips (SoCs). The devices or ICs can be incorporated into or used with, for example, consumer electronic products, such as computers, cell phones, and Personal Digital Assistants (PDAs).

Figure 1A:
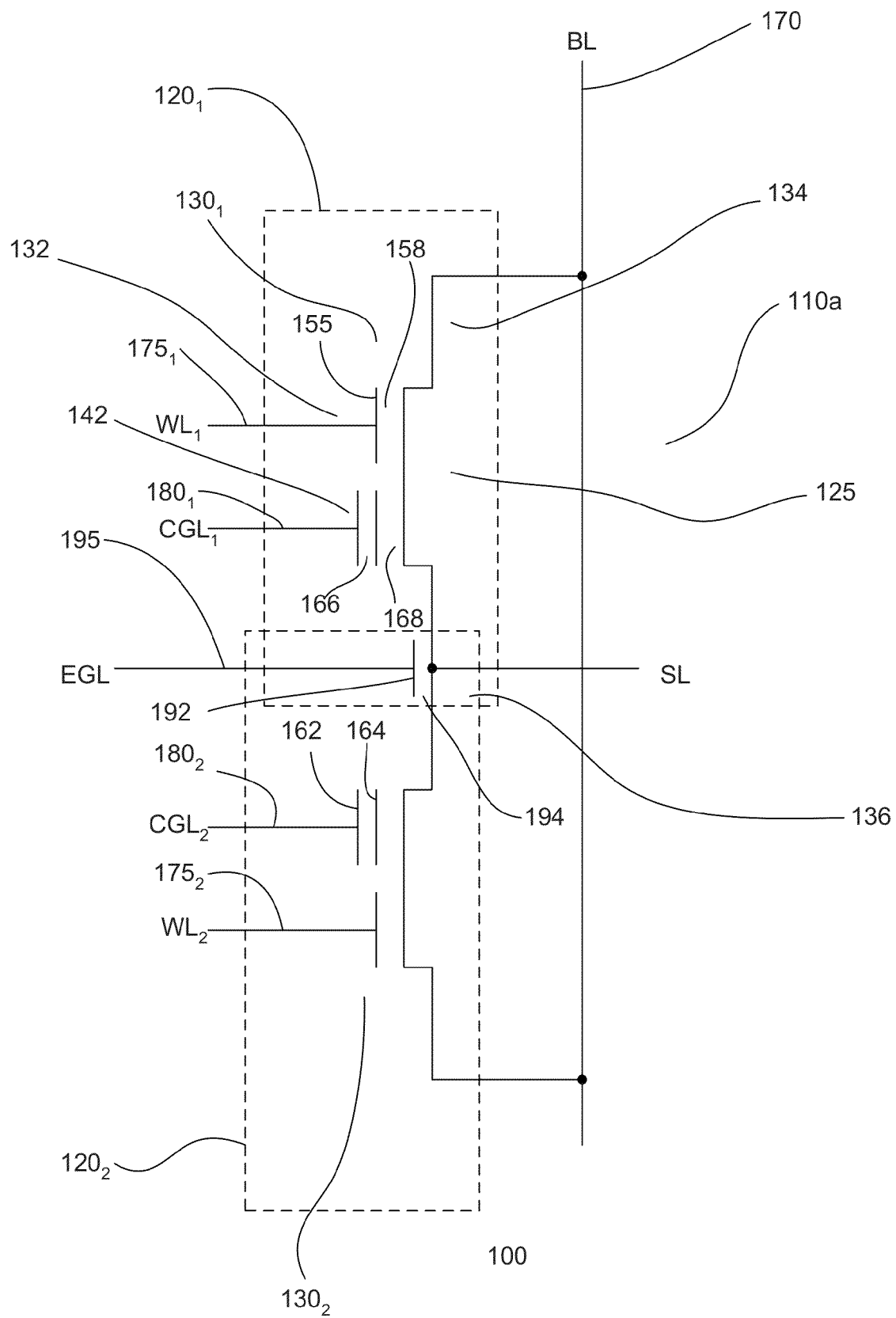
FIGS. 1a and 1b show schematic diagrams of various embodiments of a memory cell.

FIG. 1a shows a schematic diagram of an embodiment of a device 100. The device, as shown, includes a memory cell pair 110a. The memory cell pair includes first and second memory cells $120_1$ and $120_2$. The memory cells, in one embodiment, are NVM cells. For example, the memory cells are floating gate metal-oxide-semiconductor (FGMOS) NVM cells. Providing other types memory cells may also be useful. In FIG. 1, some reference numerals may include a subscript. The subscript indicates which memory cell of the memory cell pair that the element is associated. For example, a reference numeral with a subscript 1 indicates that the element is associated with the first memory cell of the memory cell pair; a reference numeral with a subscript 2 indicates that the element is associated with the second memory cell of the memory cell pair. In some instances, the description may refer to elements generally without including the subscript.

A memory cell includes first and second gates 132 and 142. In one embodiment, the first and second gates serve as a split gate for a split gate transistor 130. For example, the split gate transistor includes a split gate disposed between first and second terminals 134 and 136. The first and second gates of the split gate share a common channel 125. The first gate serves as an access gate of the memory cell. The access gate includes an access gate electrode 155 and an access gate dielectric 158 separating the gate from a transistor body 125. As for the second gate, it serves as a storage gate. The storage gate includes first and second sub-storage gates 162 and 164. The first sub-storage gate serves as a control gate (CG) and the second sub-storage gate serves as a floating gate (FG). The CG is separated from the FG gate by a CG dielectric 166 and the FG is separated from the transistor body by a FG dielectric 168.

A wordline 175 is coupled to the access gate while a control gate line 180 is coupled to the control gate. For example, a first wordline $WL_1$ is coupled to the access gate of the first memory cell and a first control gate line $CGL_1$ is coupled to the control gate of the first memory cell; a second wordline $WL_2$ is coupled to the access gate of the second memory cell and a second control gate line $CGL_2$ is coupled to the control gate of the second memory cell.

The first and second terminals may be doped regions. The doped regions, for example, include first polarity type dopants. The doped regions, for example, are n-type doped regions to form n-type memory cells. Providing p-type doped regions for p-type memory cells may also be useful. In one embodiment, the first cell terminal serves as a bitline terminal or doped region and the second cell terminal serves as a source line (SL) terminal or doped region. Other suitable configurations may also be useful.

As shown, the memory cells of the memory cell pair share a common second cell terminal. For example, the memory cells share a common source line doped region. The first cell terminals, such as bitline doped regions, are coupled to a bitline (BL) 170. For example, the first terminals of the memory cell pair are coupled to a common BL. In one embodiment, the source line doped region is a raised source line doped region. For example, the raised source line doped region is disposed above the surface of a substrate. The raised source line doped region is elevated with respect to the substrate surface. In one embodiment, the raised source line doped region is raised or elevated with respect to the bitline doped regions. For example, the top and bottom of the raised source line doped region is elevated with respect to the top and bottom of the bitline doped region. The raised source line doped region serves as or is coupled to a source line (SL). The source line is common to all memory cells of a row of memory cells and is joined by an active area. In other embodiments, the bitline doped region may be raised bitline doped region to enhance short channel effect of memory cell. The second terminal is separated from an erase gate (EG) 192 by an EG dielectric 194. The EG is coupled to an EG line (EGL) 195. The EG is a common EG of the memory cell pair. The EGL is common to all memory cells of a row of memory cells. In one embodiment, the WLs, CGLs, SL and EGL are disposed in a first direction while the BL is disposed in a second direction orthogonal to the first direction. Other arrangements may also be useful.

Although only 1 memory cell pair is shown, it is understood that additional memory cell pairs may be provided to form a column of memory cell pairs. For example, additional memory cell pairs may be provided and coupled to BL, forming a column of memory cells. Furthermore, multiple columns of memory cells can be configured to form an array of memory cells. For example, the columns may be interconnected by WLs, SLs, CGLs and EGLs.

Figure 1B:
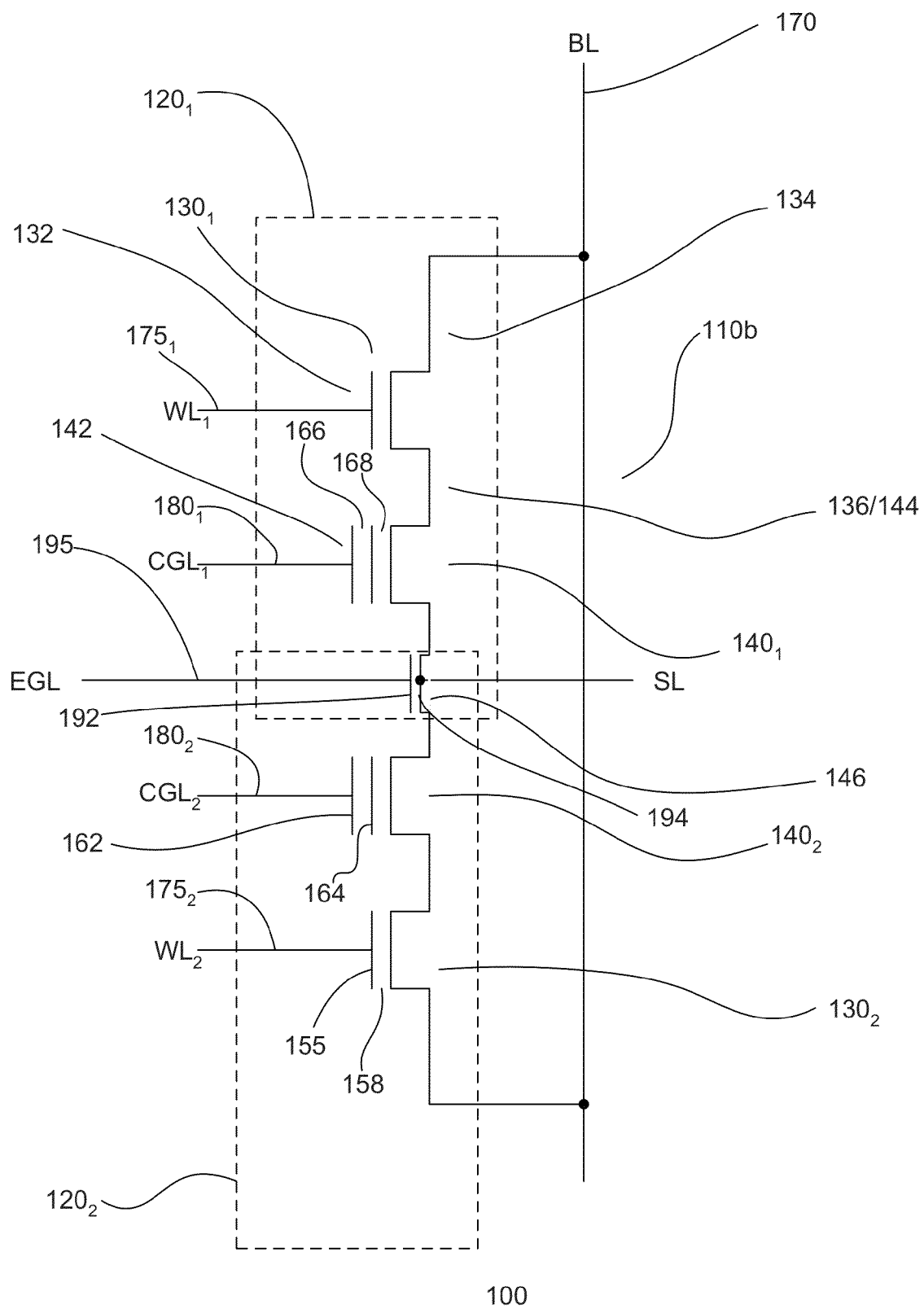

FIG. 1b shows a schematic diagram of another embodiment of a device 100. The device, as shown, includes a memory cell pair 110b. The cell pair may be similar to that described in FIG. 1a. Common elements may not be described or described in detail. The memory cell pair includes first and second memory cells $120_1$ and $120_2$.

A memory cell includes first and second gates 132 and 142. In one embodiment, the first and second gates are gates of first and second transistors 130 and 140. For example, the first memory cell includes first and second transistors $130_1$ and $140_1$ while the second memory cell includes first and second transistors $130_2$ and $140_2$, each with first and second gates. The first transistor serves as an access transistor and the second transistor serves as a storage transistor. The access or first transistor includes an access gate 132 between first and second access terminals 134 and 136. The first access terminal serves as a first terminal, such as the bitline terminal. The access gate includes an access gate electrode 155 and an access gate dielectric 158. The access gate dielectric separates the access gate electrode from the access transistor body or channel.

As for the second transistor, it serves as a storage transistor. The storage transistor includes a storage gate 162 between first and second storage terminals 144 and 146. The first and second storage terminals, for example, are storage doped regions with first polarity type dopants. The second storage terminal, for example, serves as a second cell terminal, such as a source line terminal or doped region. The storage gate includes first and second sub-storage gates 162 and 164. The first sub-storage gate serves as a CG and the second sub-storage gate serves as a FG. The CG is disposed over and separated from the CG by a CG dielectric 166 and the floating gate is separated from the storage transistor body by a FG dielectric 168.

A wordline 175 is coupled to the access gate while a control gate line 180 is coupled to the control gate. For example, a first wordline $WL_1$ is coupled to the access gate of the first memory cell and a first control gate line $CGL_1$ is coupled to the control gate of the first memory cell; a second wordline $WL_2$ is coupled to the access gate of the second memory cell and a second control gate line $CGL_2$ is coupled to the control gate of the second memory cell.

In one embodiment, the access and storage transistors are coupled in series. As shown, the second access terminal of the access transistor and first storage terminal of the storage transistor form a common terminal or doped region, forming the serial coupling between the access and storage transistors. The first terminal of the access transistor, which serves as the bitline terminal or doped region, is coupled to a BL 170. For example, the first terminals of the access transistors of the first and second memory cells are coupled to BL.

As for the second terminal of a storage transistor, it serves as a source line terminal of a memory cell. In one embodiment, the source line terminal is a raised source line terminal or doped region. For example, the raised source line doped region is disposed above the bitline doped region. The raised source line doped region is elevated with respect to the substrate surface. In one embodiment, the raised source line doped region is raised or elevated with respect to the bitline doped region. For example, the top and bottom of the raised source line doped region is elevated with respect to the top and bottom of the bitline doped region. The raised source line doped region serves as or is coupled to a source line (SL). The source line is common to all memory cells of a row of memory cells and is joined by an active area. In other embodiments, the bitline terminals may be raised bitline terminals to enhance short channel effect of memory cell. The second cell terminal is separated from an EG 192 by an EG dielectric 194. The EG is coupled to an erase gate line (EGL).

In one embodiment, second storage terminals of the storage transistors of the memory cell pair form a common second storage terminal. For example, the SL and EGL serve as common SL and EGL for the memory cell pair. The WL, BL, CGL, SL and EGL serve as terminals of a memory cell. In one embodiment, memory cells of a memory pair share SL and EGL terminals.

Although only 1 memory cell pair is shown, it is understood that additional memory cell pairs may be provided to form a column of memory cell pairs. For example, additional memory cell pairs may be provided and coupled to BL, forming a column of memory cells. Furthermore, multiple columns of memory cells can be configured to form an array of memory cells. For example, the columns may be interconnected by WLs, SLs, CGLs and EGLs.

Figure 2:
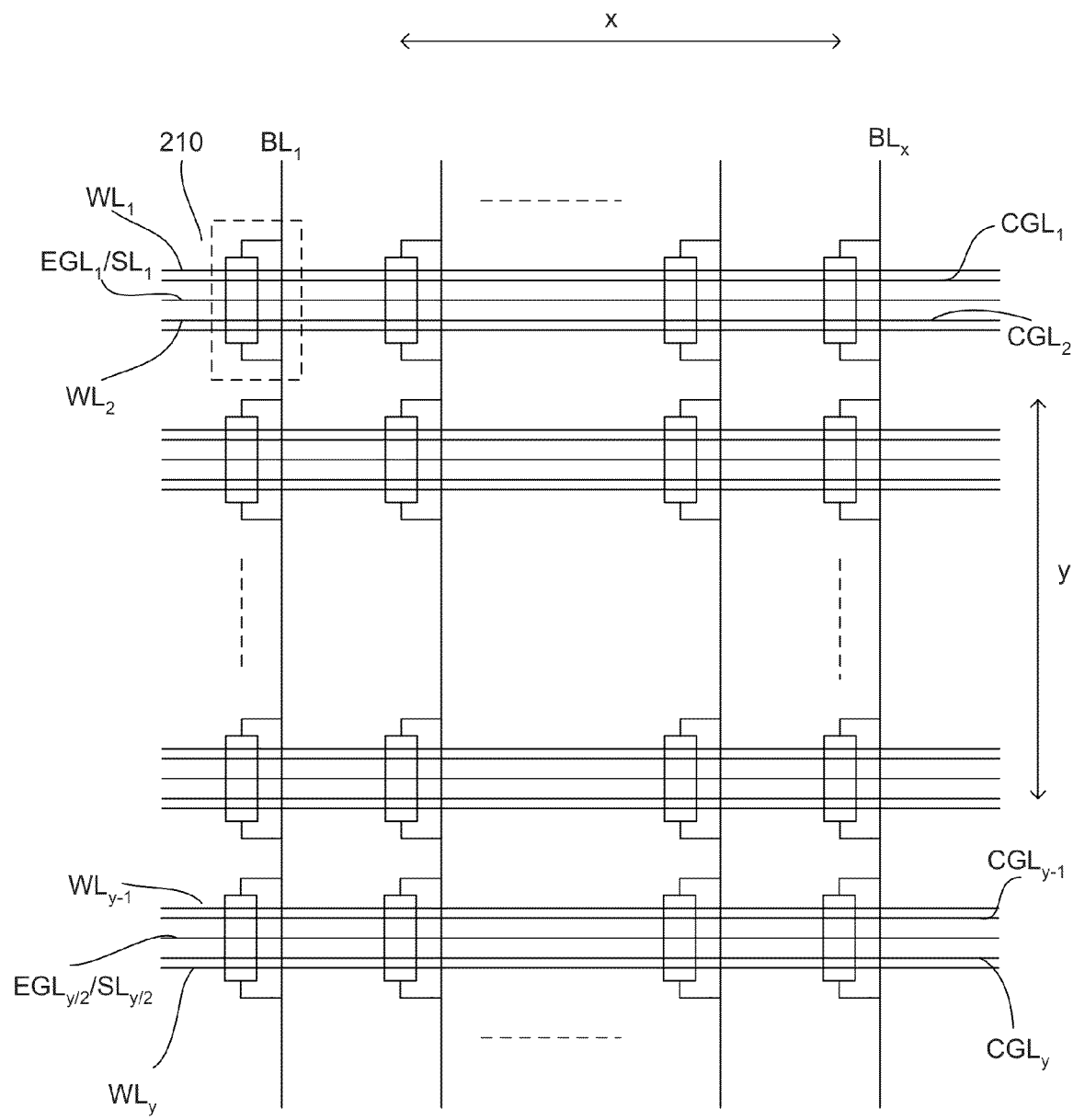
FIG. 2 shows an embodiment of a memory array.

FIG. 2 shows a plurality of memory cell pairs 210 which are configured to form a memory array 203. The plurality of memory cell pairs of the array is arranged in first (x) and second (y) directions. The first direction, for example, is in the column direction and the second direction is in the row direction. For example, the array has x columns and y rows of memory cell. The column direction is in the BL direction and the row direction is in the WL direction.

A column of memory cells shares a common BL. For example, the array has $BL_1$ to $BL_x$. A row of memory cells has a common WL, CGL, SL and EGL. A memory cell has a pair of WLs, CGLs and share common EGL and SL. For example, the array has $WL_1$ to $WL_{y-1}$, $CGL_1$ to $CGL_{y-1}$, $EGL_1$ to $EGL_{y/2}$ and $SL_1$ to $SL_{y/2}$. The memory array may be separated into sectors. A sector, for example, includes 8 rows and 2,000 columns. An array may include about 64 sectors for a 1 MB memory. Providing other size sectors or other number of sectors may also be useful. Memory cell pairs may be isolated by, for example, isolation regions. Providing other row and column configurations may also be useful.

In one embodiment, the memory cells of a sector share common CGLs. Sharing of common CGLs advantageously reduce the number of CG decoders needed, thereby reducing complexity and design area of the device. A SGL controls an individual row of cells in the sector. By applying appropriate voltages to the CGLs, SGLs, PGLs and BLs, a bit or multiple bits of the memory sector may be selected for accessing. In some embodiments, an erase operation may be applied to a column, a row or a sector. As for a program or a read operation, it may be applied by a single bit through enabling the select/access gate transistor.

A memory cell may be accessed by applying appropriate voltages to the terminals. A memory access may include a program, read or erase operation. In one embodiment, a program access injects electrons into the FG while an erase operation means electrons tunnel from the FG to the EG. Table 1 below shows various signals applied to the terminals of a memory array of selected and non-selected cells for the different memory operations:

TABLE 1

| Terminals | Operations | Read | Program | Erase |
|---|---|---|---|---|
| WL | sel | Vcc | Vt < V < Vcc | 0 V |
| | non-sel | 0 V | 0 V | 0 V |
| SL | sel | 0 V | 4.5 V | 0 V |
| | non-sel | 0 V | 0 V | 0 V |
| BL | sel | Vref | <1 V | 0 V |
| | non-sel | Vref | Vcc | 0 V |
| CG | sel | Vcc | 10 V | 0 V |
| | non-sel | 0 V | 0 V | 0 V |
| EG | sel | 0 V | 4.5 V | 10-12 V |
| | non-sel | 0 V | 0 V | 0 V |

The voltages shown in Table 1 are for n-type memory cells. The voltages are exemplary voltages. For example, Vref or Vcc may be about 1.2V. Applying other voltages to the terminals for different operations may also be useful.

Figure 3A:
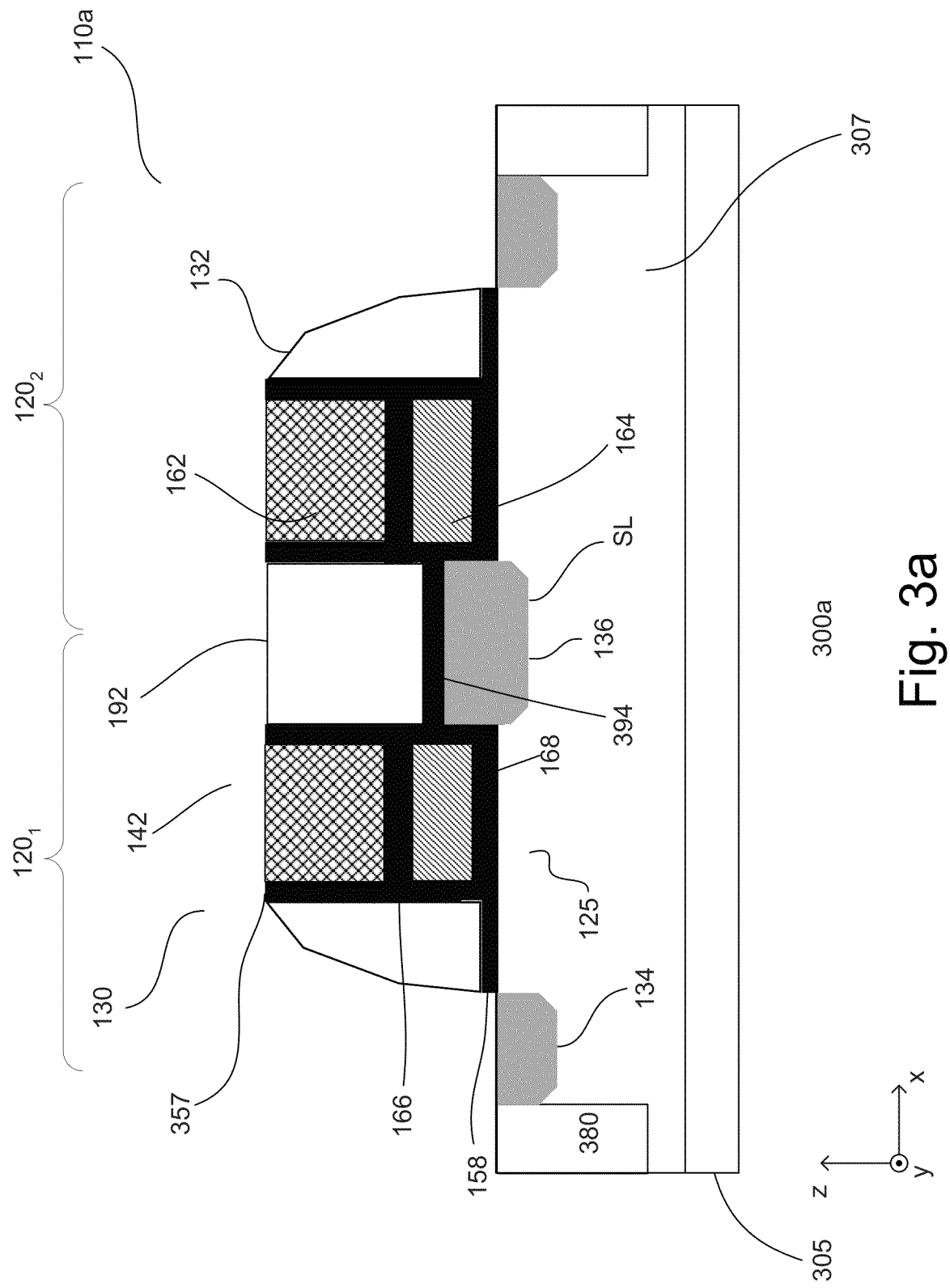
FIGS. 3a and 3b show cross-sectional views of various embodiments of a memory cell.

FIG. 3a shows a cross-sectional view of an embodiment of a device 300a. The device includes a memory cell pair 110a. The memory cell pair may be similar to that described in FIG. 1a. Common elements may not be described or described in detail. The device includes a substrate 305. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

The substrate may be prepared with a memory region containing memory cells of the device. The memory region can be referred to as an array region. Providing a substrate prepared with other types of regions (not shown) may also be useful. For example, the substrate may include a logic region for support of other types of logic circuitry. The substrate may also include regions for other types of circuitry, depending on the type of device or IC. For example, the logic region may include sub-regions for high voltage (HV), intermediate voltage (IV) and low voltage (LV) devices.

In one embodiment, the memory cells are NVM memory cells. Providing other types of memory cells may also be useful. As shown, the memory cell region includes first and second memory cells $120_1$ and $120_2$. The first and second memory cells may be a memory cell pair 110a of the device. For example, the memory cell pair may be adjacent memory cells of a column of memory cells. It is understood that the memory cell region includes numerous memory cells arranged in columns and rows to form a memory array. The array may be configured to have sub-arrays or sectors.

The array region may include a doped well 307. In one embodiment the doped well is doped with second polarity type dopants for first polarity type memory cells. For example, the second polarity type may be p-type for n-type memory cells. Providing n-type doped well for p-type memory cells may also be useful. The doped well may be lightly or intermediately or heavily doped. Providing a doped well having other dopant concentrations may also be useful. The doped well may be a common doped well in the array region for the memory cells. In one embodiment, the array well is biased at an array well bias voltage ($Vb_{bias}$). In one embodiment, $V_{bias}$ is about 0V. The second polarity type doped well serves as a well for a first polarity type device. In one embodiment, the second polarity type includes p-type. For example, the p-type doped well serves as a well for a n-type memory cell. Providing a n-type doped well may also be useful. P-type dopants can include boron (B), aluminum (Al), indium (In) or a combination thereof while n-type dopants can include phosphorus (P), arsenic (As), antimony (Sb) or a combination thereof.

The substrate includes isolation regions 380 to isolate active device regions from other active device regions, as required. The isolation regions, for example, are shallow trench isolation (STI) regions. Other types of isolation regions are also useful. As shown, an isolation region may be provided to isolate the memory cell pair from other memory cell pairs. Other configurations of isolation regions may also be useful.

In one embodiment, the memory cell includes a transistor 130 disposed on the substrate. The transistor, in one embodiment, is a split gate transistor. For example, the transistor includes a split gate disposed between first and second terminals 134 and 136. The split gate includes first and second gates 132 and 142. The gates share a common channel 125. The channel is disposed below the split gate and between the first and second terminals. As shown, the first gate is adjacent to the first terminal and the second gate is adjacent to the second terminal. The first gate serves as an access gate and the second gate serves as a storage gate.

The storage gate, in one embodiment, includes first and second sub-storage gates 162 and 164. The first sub-storage gate serves as a CG and the second sub-storage gate serves as a FG. The CG includes a CG electrode disposed over the FG electrode, with a CG dielectric 166 between them. A FG dielectric 168 is disposed between the FG and substrate.

The storage gate electrodes may include polysilicon. The storage gate electrodes may be a n-type doped gate electrodes. The dopant concentration of the storage gate electrodes may be about 1E14 to 5E15 cm$^{-2}$ with implant depth near poly surface. Doping the storage gate electrodes, for example, reduces resistivity and improves the performance of the memory cell. The storage gate electrodes may be doped with other types of dopants. Other types of gate electrode materials, such as metals to form metal gates, may also be useful. The storage gate electrodes need not be formed from the same material. For example, the FG gate electrode may include a different material than the CG electrode. The FG gate electrode, for example, may be about 10 to 80 nm thick whereas the CG gate electrode, for example, may be about 50 to 150 nm thick. Other thickness dimensions for the FG and CG may also be useful. In one embodiment, the FG gate electrode may include nanocrystals. For example, the FG gate electrode may include embedded Si/Ge/Si—Ge nanocrystals in dielectrics.

The CG dielectrics may include silicon oxide. Other types of dielectric material, such as silicon oxynitride, $Si_3N_4$, high-k dielectrics may also be useful. In some embodiments, the CG dielectric may be a composite dielectric layer having multiple dielectric layers. For example, the dielectric may include an oxide/nitride/oxide (ONO) dielectric stack. The CG dielectric layer serves as a blocking layer to prevent the escape of electrons from the FG. The CG dielectric layer, for example, may be about 8 to 30 nm thick. In one embodiment, the CG dielectric layer is about 15 nm thick. Other thicknesses for the CG dielectric layer may also be useful.

As for the FG dielectric layer, it serves as a tunneling dielectric layer. The FG dielectric layer may be silicon oxide. For example, the FG dielectric may be thermal silicon oxide. Other types of FG dielectric layers, such as high-k materials, may also be useful. The thickness of the FG dielectric layer may be about 8 to 9 nm. Providing a FG dielectric layer of other thicknesses or other types of gate dielectric layers may also be useful.

Sidewall storage gate (SSG) dielectric layers 357 are provided on sidewalls of the storage gate. The SSG dielectric layers, for example, are silicon oxide. Other types of dielectric materials may also be useful for the SSG dielectric layers. For example, the SSG dielectric layers may include SiON, $Si_3N_4$, high-k dielectrics, etc. The thickness of the SSG dielectric layers may be about 12 nm. Other thicknesses may also be useful so long as it is sufficiently thick to isolate the access gate from the storage gate.

As for the access gate (AG), it includes an access gate electrode disposed adjacent to a sidewall of the storage gate and adjacent to the first terminal. For example, the access gate electrode is disposed between the storage gate and the first terminal or doped region, contacting the SSG dielectric layer. An access gate dielectric 158 is disposed between the substrate and the access gate. In one embodiment, the access gate is a gate spacer disposed on a sidewall of the storage gate proximate to the first terminal. The access gate electrode, for example, may be polysilicon. The access gate electrode may be an n-type doped polysilicon gate electrode. The dopant concentration of the access gate electrode, for example, may be about 1E14 to 5E15 cm$^{-2}$. Other dopant concentration for the access gate electrode may also be useful. Other types of gate electrode materials, such as metals to form metal gates, may also be useful. The width of the access gate electrode may be about sub-critical dimension (sub-CD) dimension, depending on, for example, height of the CG, deposition and RIE process used for forming the AG. Providing an access gate with other widths may also be useful.

As for the access gate dielectric layer, it may be silicon oxide. The access gate dielectric layer, for example, is thermal silicon oxide. Other types of access gate dielectric layer may also be useful. The thickness of the access gate dielectric layer, for example, is about 20 to 80 Å. In one embodiment, the thickness of the access gate dielectric layer is about 24 Å. Other thicknesses for the access gate dielectric layer may also be useful.

The SSG dielectric and CG dielectric may be referred to as an intergate dielectric, separating the various gates, such as the FG, CG and AG. In the case that the gates are polysilicon gates, the intergate dielectric may be referred to as an interpoly dielectric. The intergate dielectric may be formed from different dielectric layers. For example, the SSG and CG may be different dielectric layers, as well as different types of dielectric layers. Other configurations of the intergate dielectric may also be useful.

The split gate, for example, may be a split gate conductor. The split gate conductor may be a common split gate conductor for a plurality of transistors in, for example, the second (y) or row direction.

As discussed, the split gate is disposed between first and second cell terminals. The first and second cell terminals, for example, are first and second doped regions. The doped regions include first polarity type dopants. For example, the doped regions are heavily doped regions with first polarity type dopants. In one embodiment, the first polarity type is n-type. Providing first polarity type which is p-type may also be useful. The doping concentration of the doped regions may be about 1E14 to 5E15 cm$^{-2}$. Other dopant concentrations may also be useful. The first doped region serves as a bit line terminal or doped region while the second doped region serves as a source line terminal or doped region.

In one embodiment, the second doped region 136 is coupled to or serves as a SL. The SL, for example, traverses a row of memory cell pairs. Providing a second doped region which does not traverse a row of memory cell pairs may also be useful. The second doped region may be coupled to a SL disposed in a metal level above. In one embodiment, the memory cells of the memory cell pair share a common second doped region. For example, the SL is a common SL for the memory cells of the cell pair.

In one embodiment, the second doped region is a raised doped region or SL. For example, the top of the second doped region is elevated from the surface of the substrate. The elevated portion of the second doped region may be a surface semiconductor layer disposed on the surface of the substrate while a lower portion may be the substrate. The surface semiconductor layer may be an epitaxial semiconductor layer. Other types of surface semiconductor layers may also be useful. For example, the semiconductor layer may be a crystallized amorphous semiconductor layer or polycrystalline semiconductor layer. The semiconductor layer may be a silicon semiconductor layer. Silicon-based semiconductor as well as other types of semiconductor layers may also be useful. In some cases, the surface semiconductor layer may extend below the surface of the substrate. Other types or configurations of the surface semiconductor layer may also be useful. The height of the second doped region above the substrate should be below a top surface of the FG electrode. For example, the height of the second doped region may be about 20 nm for a FG with a thickness of about 80 nm. Other suitable dimensions may also be useful.

The second doped region should have a thickness (e.g., from top to bottom) sufficient to accommodate high voltage requirements of the SL. For example, the thickness of the second doped region should be sufficient to handle 4.5 V. Providing second doped region which accommodates other voltages may also be useful. By elevating the second doped region, its bottom can be shallower than the first doped regions.

An EG 192 is disposed above the second doped region or SL. The EG, for example, may be polysilicon. Other types of gate electrode materials may also be useful for the EG. The EG may be a n-type doped gate electrode. The EG may be doped with other types of dopants. An EG dielectric 394 is disposed between the EG and second doped region. The EG dielectric, for example, is silicon oxide. In one embodiment, the EG dielectric is thermal oxide. Other types of dielectric materials may also be useful. The thickness of the EG dielectric, for example, is about 20 nm. Other thicknesses may also be useful. Separating the EG from the CGs is the CG sidewall dielectric layer. The EG, shown, includes a planar or substantially planar surface. Providing a non-planar top surface for the EG may also be useful. For example, the non-planarity may result from RIE process.

The various gate dielectric layers separating the various gates, for example, may be referred to collectively as an intergate dielectric. The intergate dielectric may be composed of different dielectric layers as well as different types of dielectric layers.

As for the first doped region, it is coupled to a BL. The first doped regions of the first and second memory cells are coupled to the BL. For example, the memory cells of the pair are coupled to the same BL. The memory cells of the pair may form part of a column of memory cells. The BL, for example, may be disposed in a metal level above and coupled to the first doped regions by contacts (not shown). The BL, for example, is disposed along a first (x) or column direction.

The access gate electrode serves as or is coupled to a WL. For example, the access gate electrode of the first memory cell serves as or is coupled to a first $WL_1$ and the access gate electrode of the second memory cell serves as or is coupled to a second $WL_2$. The control gate electrode serves as or is coupled to a control gate line CGL. For example, the control gate electrode of the first memory cell serves as or is coupled to a first $CGL_1$ and the control gate electrode of the second memory cell serves as or is coupled to a second $CGL_2$. The CGLs and WLs are disposed in a metal level above. The SLs, WLs, EGLs and CGLs are disposed along a second (y) or row direction orthogonal to the first direction.

A dielectric layer may be disposed over the transistor. For example, the dielectric layer may be a silicon oxide layer. Other types of dielectric layers may also be useful. The dielectric layer may serve as a pre-metal dielectric (PMD) layer or contact level CA. Contacts may be provided to the different terminals of the memory cell pair. A metal level, such as M1, may be disposed over the CA level. The metal level includes metal lines. Interlevel dielectrics (ILDs) may be provided. An ILD includes a via and metal level for providing interconnections. For example, BLs may be provided in M1 while SLs, WLs, EGLs and CGLs are provided in M2. Other configurations may also be useful.

Figure 3B:
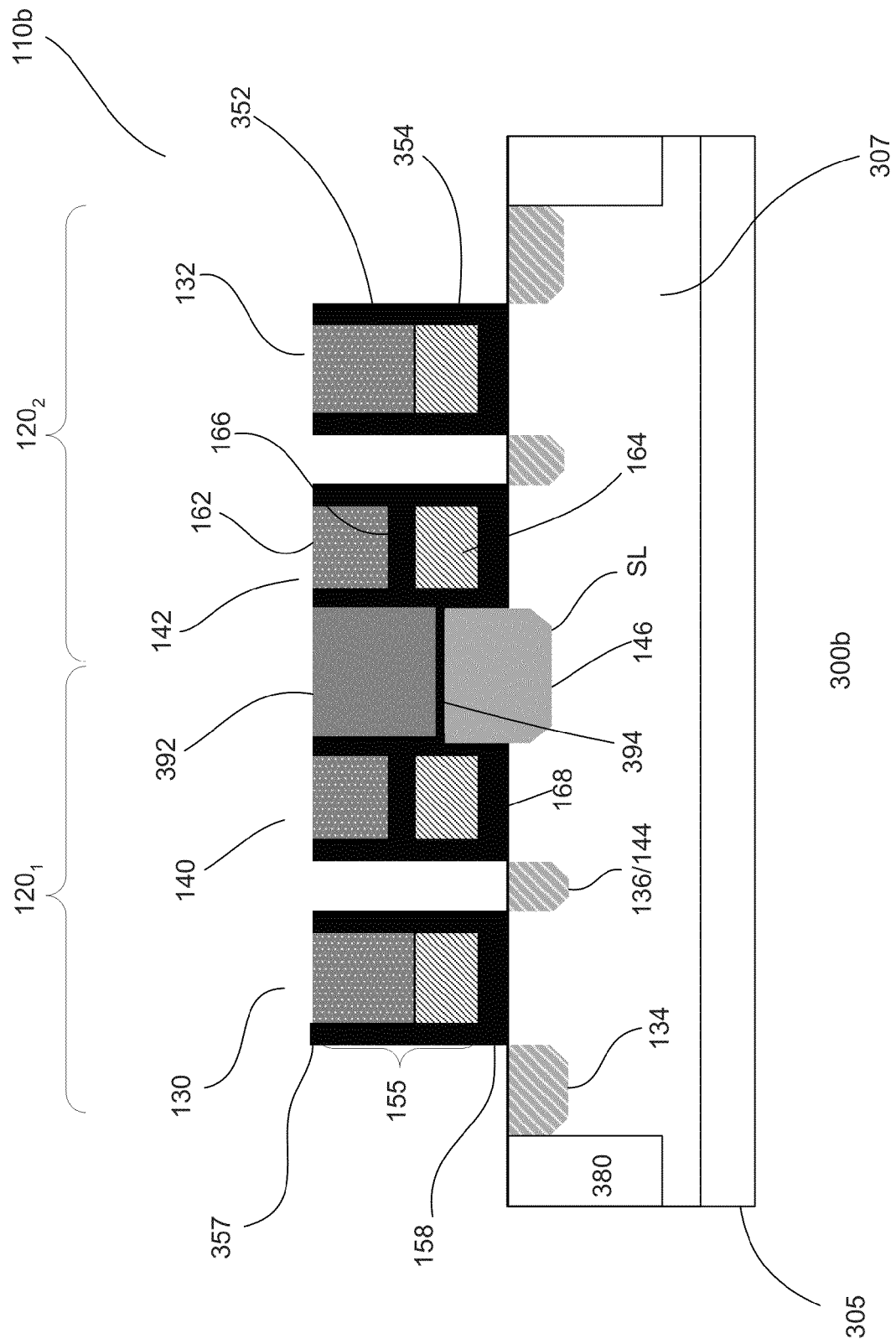

FIG. 3b shows a cross-sectional view of another embodiment of a device 300b. The device includes a memory cell pair 110b. The memory cell pair may be similar to that described in FIG. 1b and FIG. 3a. Common elements may not be described or described in detail. The device includes a substrate 305. The substrate, for example, may be a silicon substrate. Other types of semiconductor substrate may also be used. The substrate may be prepared with a memory region containing memory cells of the device. The memory region can be referred to as an array region. Providing a substrate prepared with other types of regions (not shown) may also be useful. For example, the substrate may include a logic region for support of other types of logic circuitry. The substrate may also include regions for other types of circuitry, depending on the type of device or IC. For example, the logic region may include sub-regions for high voltage (HV), intermediate voltage (IV) and low voltage (LV) devices.

In one embodiment, the memory cells are NVM memory cells. Providing other types of memory cells may also be useful. As shown, the memory cell region includes first and second memory cells $120_1$ and $120_2$. The first and second memory cells form a memory cell pair. For example, the memory cell pair may be adjacent memory cells of a column of memory cells. It is understood that the memory cell region includes numerous memory cells arranged in columns and rows to form a memory array. The array may be configured to have sub-arrays or sectors.

The array region may include a doped well 307. In one embodiment the doped well is doped with second polarity type dopants for first polarity type memory cells. For example, the second polarity type may be p-type for n-type memory cells. Providing n-type doped well for p-type memory cells may also be useful. The doped well may be lightly or intermediately or heavily doped. Providing a doped well having other dopant concentrations may also be useful. The doped well may be a common doped well in the array region for the memory cells. In one embodiment, the array well is biased at an array well bias voltage ($V_{bias}$). In one embodiment, $V_{bias}$ is about 0V. The second polarity type doped well serves as a well for a first polarity type device. In one embodiment, the second polarity type includes p-type. For example, the p-type doped well serves as a well for a n-type memory cell. Providing a n-type doped well may also be useful.

The substrate includes isolation regions 380 to isolate active device regions from other active device regions, as required. The isolation regions, for example, are STI regions. Other types of isolation regions are also useful. As shown, an isolation region may be provided to isolate the memory cell pair from other memory cell pairs. Other configurations of isolation regions may also be useful.

A memory cell includes first and second gates 132 and 142 disposed between first and second cell terminals 134 and 146. The first gate serves as an access gate and the second gate serves as a storage gate. The first gate is proximate to the first cell terminal and the second gate is proximate to the second cell terminal. For example, the first terminal is a first access terminal and the second terminal is a second storage terminal. In one embodiment, the access gate is a gate of an access transistor 130. The access gate is disposed between first and second access terminals 134 and 136. Likewise, the storage gate is a gate of a storage transistor and is disposed between first and second storage terminals 144 and 146.

The storage gate includes first and second sub-storage gates 162 and 164. The first sub-storage gate serves as a CG and the second sub-storage gate serves as a FG. The CG is disposed over and separated from the CG by a CG dielectric 166 and the floating gate is separated from the storage transistor body by a FG dielectric 168. The CG and FG, for example, may be polysilicon. In one embodiment, the CG and FG are doped polysilicon. Other types of gate electrode materials may also be useful. The CG and FG need not be of the same material.

The CG dielectrics may include silicon oxide. Other types of dielectric material, such as silicon oxynitride, $Si_3N_4$, high-k dielectrics may also be useful. In some embodiments, the CG dielectric may be a composite dielectric layer having multiple dielectric layers. For example, the dielectric may include an oxide/nitride/oxide (ONO) dielectric stack. The CG dielectric layer serves as a blocking layer to prevent the escape of electrons from the FG. As for the FG dielectric layer, it serves as a tunneling dielectric layer. The FG dielectric layer may be silicon oxide, such as thermal silicon oxide. Other types of FG dielectric layers, such as high-k materials, may also be useful.

The access gate includes an access gate electrode 155 and an access gate dielectric 158. The access gate dielectric separates the access gate electrode from the access transistor body or channel. In one embodiment, the access gate electrode includes first and second gate electrodes 352 and 354. The first and second access gate electrodes, for example, correspond to CG and FG electrodes. For example, the first and second access gate electrodes are of the same material as the CG and FG electrodes, except that they are not separated by a dielectric layer. As for the access gate dielectric layer, it may be silicon oxide, such as thermal oxide. Other types of access gate dielectric layers and/or other configurations of access gate electrode may also be useful. For example, the access gate electrode may be different from the electrodes of the storage gate.

Sidewall storage gate (SSG) dielectric layers 357 are provided on sidewalls of the storage gate. The SSG dielectric layers, for example, are silicon oxide. Other types of dielectric materials may also be useful for the SSG dielectric layers. For example, the SSG dielectric layers may be SiON, $Si_3N_4$, high-k dielectrics, etc. The thickness of the SSG layers may be about 12 nm. Other thicknesses may also be useful.

The gates, for example, may be gate conductors. The gate conductors may be common gate conductors for a plurality of transistors in, for example, the second (y) or row direction.

As discussed, the gates are disposed between first and second cell terminals. The first and second cell terminals, for example, are first and second doped regions. The doped regions include first polarity type dopants. For example, the doped regions are heavily doped regions with first polarity type dopants. In one embodiment, the first polarity type is n-type. Providing first polarity type which is p-type may also be useful. The doping concentration of the doped regions may be about 1E14 to 5E15 $cm^{-2}$. Other dopant concentrations may also be useful. The first doped region 134 serves as a bit line doped region while the second doped region 146 serves as a source line doped region.

In one embodiment, the second doped region is coupled to or serves as a SL. The SL, for example, traverses a row of memory cell pairs. Providing a second doped region which does not traverse a row of memory cell pairs may also be useful. For example, the second doped region may be coupled to a SL disposed in a metal level above. In one embodiment, the memory cells of the memory cell pair share a common second doped region. For example, the SL is a common SL for the memory cells of the cell pair. In one embodiment, the second doped region is a raised doped region. The second doped region should have a thickness (e.g., from top to bottom) sufficient to accommodate high voltage requirements of the SL. For example, the thickness of the second doped region should be sufficient to handle 4.5 V. Providing second doped region which accommodates other voltages may also be useful. By elevating the second doped region, its bottom can be shallower than the first doped regions.

An EG is disposed above the second doped region or SL. The EG, for example, may be polysilicon. Other types of gate electrode materials may also be useful for the EG. An EG dielectric 394 is disposed between the EG and second S/D region. The EG dielectric, for example, is silicon oxide. In one embodiment, the EG dielectric is thermal oxide. Other types of dielectric materials may also be useful. The thickness of the EG dielectric, for example, is about 20 nm. Other thicknesses may also be useful. Separating the EG from the CGs is the CG sidewall dielectric layer. The EG, shown, includes a planar or substantially planar surface. Providing a non-planar top surface for the EG may also be useful. For example, the non-planarity may result from RIE process.

As for the first doped region 134, it is coupled to a BL. The first doped regions of the first and second memory cells are coupled to the BL. For example, the memory cells of the pair are coupled to the same BL. The memory cells of the pair may form part of a column of memory cells. The BL, for example, may be disposed in a metal level above and coupled to the first doped regions by contacts (not shown). The BL, for example, is disposed along a first (x) or column direction.

The access gate electrode serves as or is coupled to a WL. For example, the access gate electrode of the first memory cell serves as or is coupled to a first $WL_1$ and the access gate electrode of the second memory cell serves as or is coupled to a second $WL_2$. The control gate electrode serves as or is coupled to a control gate line CGL. For example, the control gate electrode of the first memory cell serves as or is coupled to a first $CGL_1$ and the control gate electrode of the second memory cell serves as or is coupled to a second $CGL_2$. The CGLs and WLs are disposed in a metal level above.

A dielectric layer may be disposed over the transistor. For example, the dielectric layer may be a silicon oxide layer. Other types of dielectric layers may also be useful. The dielectric layer may serve as a pre-metal dielectric (PMD) layer or contact level CA. Contacts may be provided to the different terminals of the memory cell pair. A metal level, such as M1 may be disposed over the CA level. The metal level includes metal lines. Interlevel dielectrics (ILDs) may be provided. An ILD includes a via and metal level for providing interconnections. For example, BLs may be provided in M1 while SLs, WLs, EGLs and CGLs are provided in M2. Other configurations may also be useful.

Embodiments as described with respect to FIGS. 1a-1b, FIG. 2 and FIGS. 3a-3b above include several advantages. The raised second doped region or source line (SL) allows less lateral diffusion of SL implant and suppress short channel effect (SCE), thereby improves the programming speed as well as minimizing programming disturb as it suppresses sub-Vt leakage. The structures as described above provide lower EG coupling ratio, thereby improve erase efficiency. Memory margin is improved due to better cell current states as a result of improved SCE in view of reduced array read leakage. The structures enable WL oxide/gate length (Lg) scaling without trading off programming performance. Furthermore, improved programming/erase operation efficiency is possible due to lower programming/erase voltage or time.

Figure 4A:
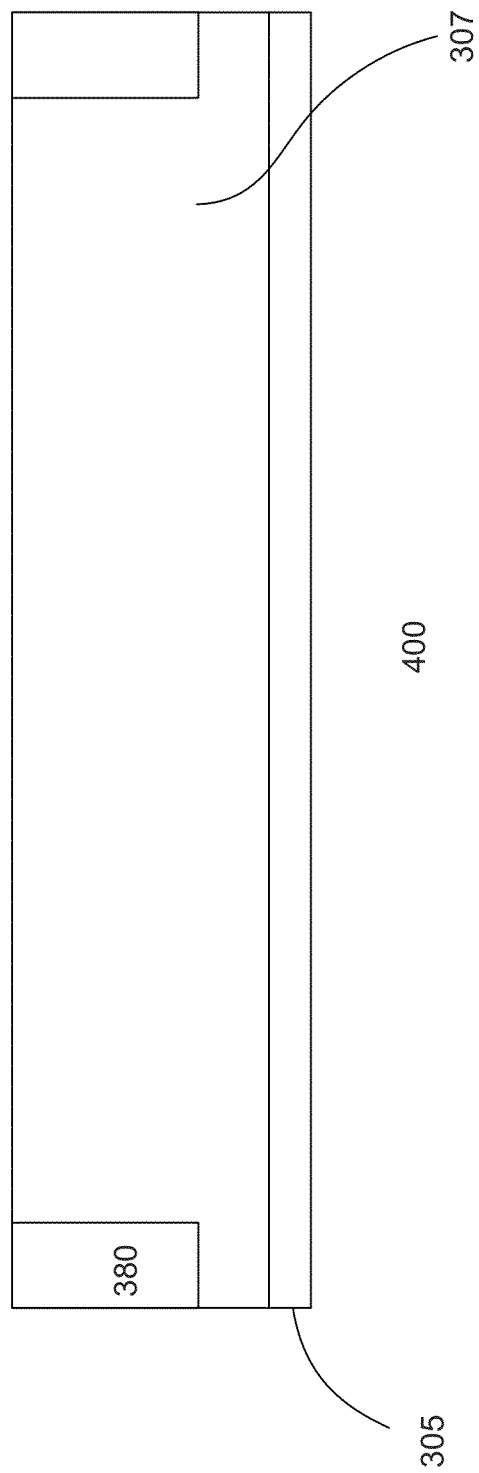

FIGS. 4a-4i show cross-sectional views of an embodiment of a process 400 for forming a device. The device, for example, is similar to that described in FIGS. 1a and 3a. Common elements may not be described or described in detail. Referring to FIG. 4a, a substrate 305 is provided. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations.

The substrate may be prepared with a memory region containing memory cells of the device. The memory region can be referred to as an array region. Providing a substrate prepared with other types of regions (not shown) may also be useful. For example, the substrate may include a logic region for support of other types of logic circuitry. The substrate may also include regions for other types of circuitry, depending on the type of device or IC. For example, the logic region may include sub-regions for high voltage (HV), intermediate voltage (IV) and low voltage (LV) devices.

The array region may include a doped well 307. In one embodiment the doped well is doped with second polarity type dopants for first polarity type memory cells. For example, the second polarity type may be p-type for n-type memory cells. Providing n-type doped well for p-type memory cells may also be useful. The doped well may be lightly or intermediately or heavily doped. Providing a doped well having other dopant concentrations may also be useful. The doped well may be a common doped well in the array region for the memory cells. In one embodiment, the array well is biased at an array well bias voltage ($V_{bias}$). In one embodiment, $V_{bias}$ is about 0V. Other voltages for $V_{bias}$ may also be useful. The second polarity type doped well serves as a well for a first polarity type device. In one embodiment, the second polarity type includes p-type. For example, the p-type doped well serves as a well for a n-type memory cell. Providing a n-type doped well may also be useful. P-type dopants can include boron (B), aluminum (Al), indium (In) or a combination thereof while n-type dopants can include phosphorus (P), arsenic (As), antimony (Sb) or a combination thereof.

Generally, the IC includes regions with both first and second type wells. To form the doped wells for different regions, ion implantation techniques, such as implantation with a mask, can be used. The first and second type wells can be formed in separate processes. Other techniques for forming the doped wells may also be useful.

The substrate includes isolation regions 380 to isolate active device regions from other active device regions, as required. The isolation regions, for example, are STI regions. Various processes can be employed to form the STI regions. For example, the substrate can be etched using etch and mask techniques to form trenches which are then filled with dielectric materials such as silicon oxide. Chemical Mechanical Polishing (CMP) can be performed to remove excess oxide and provide a planar substrate top surface. The STI regions can be formed, for example, prior to or after the formation of the doped wells. Other processes can also be used to form the STIs. Other types of isolation regions are also useful.

The substrate may be implanted with dopants to define the initial gate threshold voltage ($V_t$). For example, multiple threshold adjust implants may be performed for different types of devices.

Figure 4B:
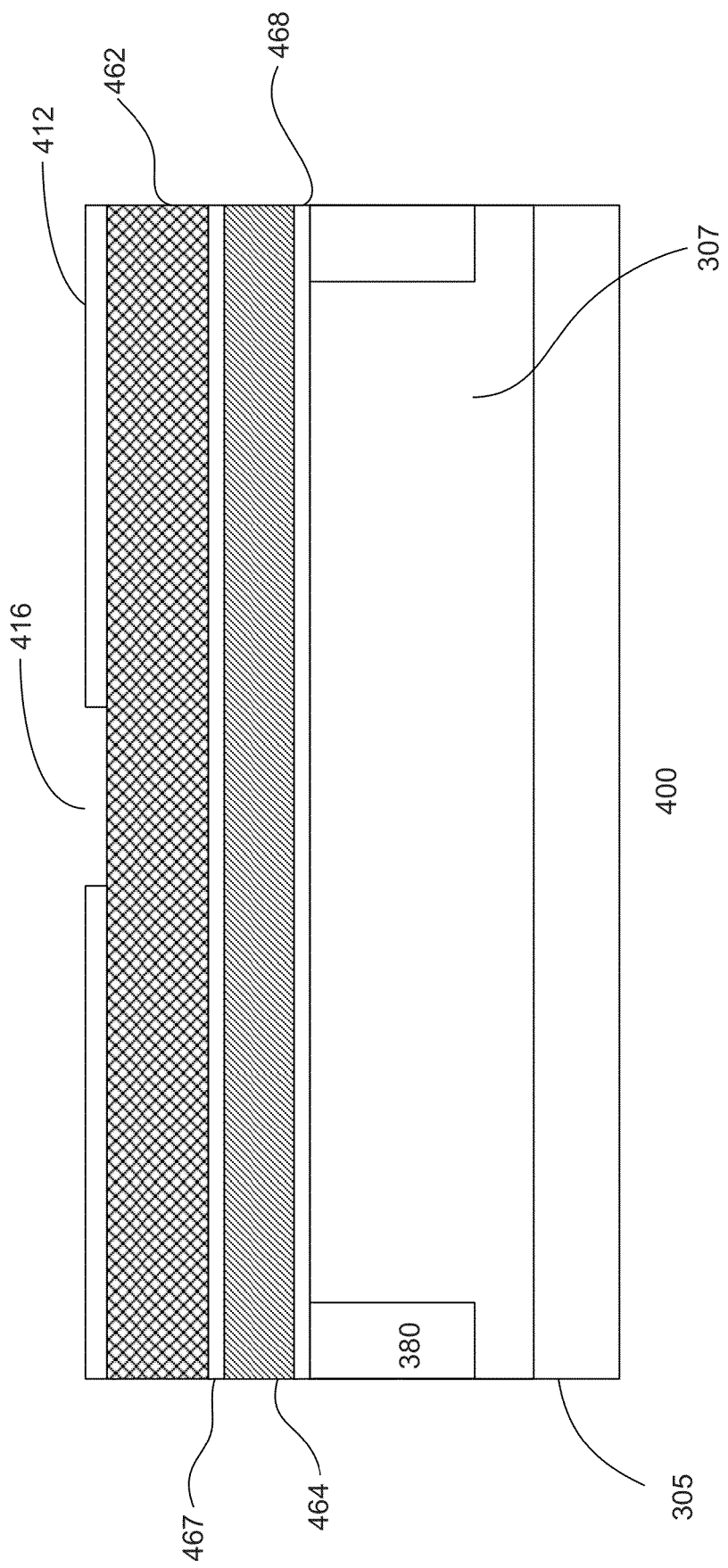

Referring to FIG. 4b, the substrate is prepared with a primary gate dielectric layer 468. In one embodiment, the gate dielectric layer may be a silicon oxide layer. The silicon oxide layer may be formed by thermal oxidation. The thermal oxidation may either be dry or wet oxidation at a temperature of about 800 to 1100° C. The thickness of the primary gate dielectric layer may be about 20 to 80 Å. Other thicknesses may also be useful. In some embodiments, the gate dielectric layer may include other types of materials, for example, such as silicon oxynitride or high-k dielectric materials. The gate dielectric layer may be formed using various techniques, such as thermal oxidation or Chemical Vapor Deposition (CVD).

A first gate electrode layer 464 is deposited on the primary gate dielectric layer 468. The first gate electrode layer is a semiconductor layer. For example, the first gate electrode layer may be polysilicon. The semiconductor gate electrode layer can be formed as an amorphous or non-amorphous layer. In one embodiment, the gate semiconductor electrode is doped, for example, with first polarity type dopants. Various techniques may be employed to dope the gate electrode, for example, in situ doping or ion implantation. Providing an undoped gate electrode layer may also be useful. Other types of gate electrode materials are also useful. For example, Si—Ge, Ge or metal may be used as the first gate electrode material. The thickness of the first gate electrode layer may be about 10 to 80 nm. Other thicknesses are also useful. To form the first gate electrode layer, techniques, such as CVD, can be used. Other forming techniques are also useful. The first gate electrode layer may be employed to form, for example, the FG.

A CG dielectric layer 467 is formed on the first gate electrode layer. The CG dielectric layer may be a part of an intergate dielectric layer. In one embodiment, the CG dielectric layer may be silicon oxide. Other types of dielectric material, such as silicon oxynitride, $Si_3N_4$, high-k dielectrics may also be useful. In other embodiments, the CG dielectric layer includes a dielectric stack. For example, the CG dielectric layer includes multiple dielectric layers. The intergate dielectric layer, in one embodiment, includes an ONO stack. The intergate dielectric layer may be formed by thermal oxidation or CVD. Other types of dielectric layers or techniques for forming the CG dielectric layer may also be useful. The thickness of the CG dielectric layer, for example, may be about 8 to 30 nm. In one embodiment, the CG dielectric layer is about 15 nm thick. Other thicknesses may also be useful.

A second gate electrode layer 462 is formed on the substrate, covering the first electrode and CG dielectric layers. The second gate electrode layer, in one embodiment, is a semiconductor layer, such as polysilicon. The second gate electrode layer can be formed as an amorphous or non-amorphous layer. In one embodiment, the second gate electrode layer is doped, for example, with first polarity type dopants. Various techniques may be employed to dope the gate electrode, for example, in situ doping or ion implantation. Providing an undoped gate electrode layer may also be useful. Other types of gate electrode materials are also useful. For example, Si—Ge, Ge or metal may be used as the second gate electrode material. The thickness of the second gate electrode layer may be about 50 to about 150 nm. Other thicknesses are also useful. To form the second gate electrode layer, techniques, such as CVD, can be used. Other techniques are also useful. It is understood that the first and second gate electrode layers need not be the same. The second gate electrode layer may be employed to form, for example, the CG. The various gate layers serve as a gate layered stack.

The process continues to form a raised doped region or source line (SL). Referring to FIG. 4b, a mask 412 is formed on the gate layered stack. The mask, for example, is a hard mask. The hard mask may be a silicon nitride hard mask. Other types of hard mask may also be useful. For example, the hard mask may be formed of a material which can etch the gate stack selectively. The hard mask is patterned to expose the gate stack. For example, the hard mask is patterned, forming an opening 416 to expose the gate stack where source line is to be formed. Patterning the hard mask, for example, may be achieved using a soft mask, such as resist (not shown). The resist is patterned by exposing the resist with an exposure source and reticle with the desired pattern. The exposed resist is developed, transferring the pattern of the reticle to the resist. To improve lithographic resolution, an Anti-Reflective Coating (ARC) can be provided beneath the photoresist. The resist is removed after patterning the hard mask. The resist, for example, may be removed by ashing. Other techniques for removing the resist mask may also be useful.

As shown in FIG. 4c, the gate layered stack is patterned. For example, the portion of the gate layered stack exposed by the hard mask is removed. In one embodiment, an anisotropic etch is performed to pattern the gate layered stack, forming an opening 497 to expose the substrate corresponding to the source line. The opening, in one embodiment, at least exposes the substrate. To ensure that the substrate is exposed, an over etch may be performed. The anisotropic etch, for example, is a reactive ion etch (RIE). Other techniques for patterning the gate layered stack may also be useful.

A dielectric spacer layer 457 is formed on the substrate, lining the surface of the gate stack and opening. The dielectric spacer layer, for example, is a silicon oxide spacer layer. Other types of dielectric spacer layers may also be useful. For example, the spacer layer may be silicon oxynitride or a silicon oxide/silicon nitride stack. The spacer layer may be formed by, for example, CVD. Other techniques for forming the spacer layer may also be useful. The thickness of the spacer layer, for example, may be about 20 nm. Other thicknesses may also be useful.

Figure 4D:
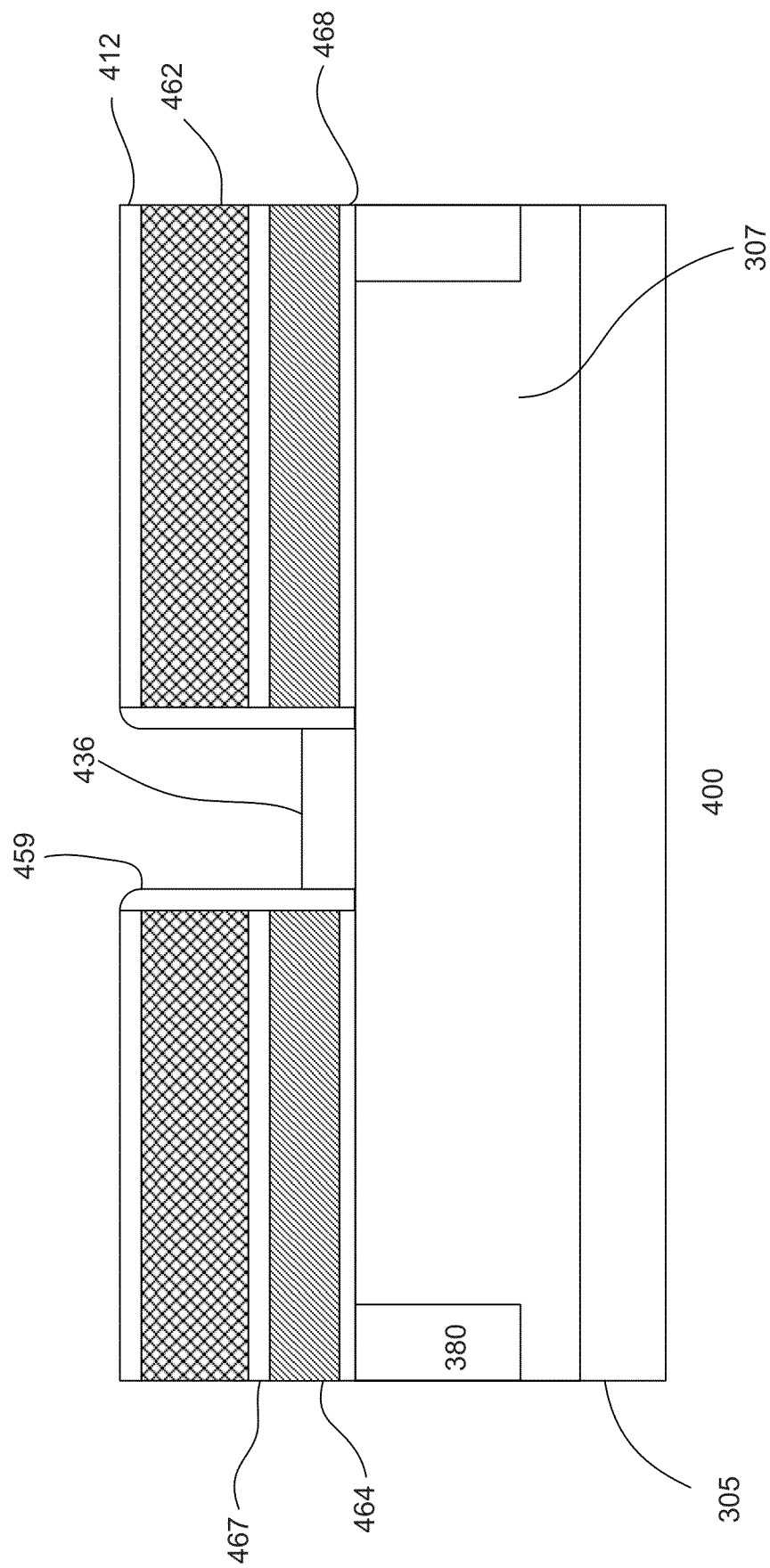
Figure 4E:
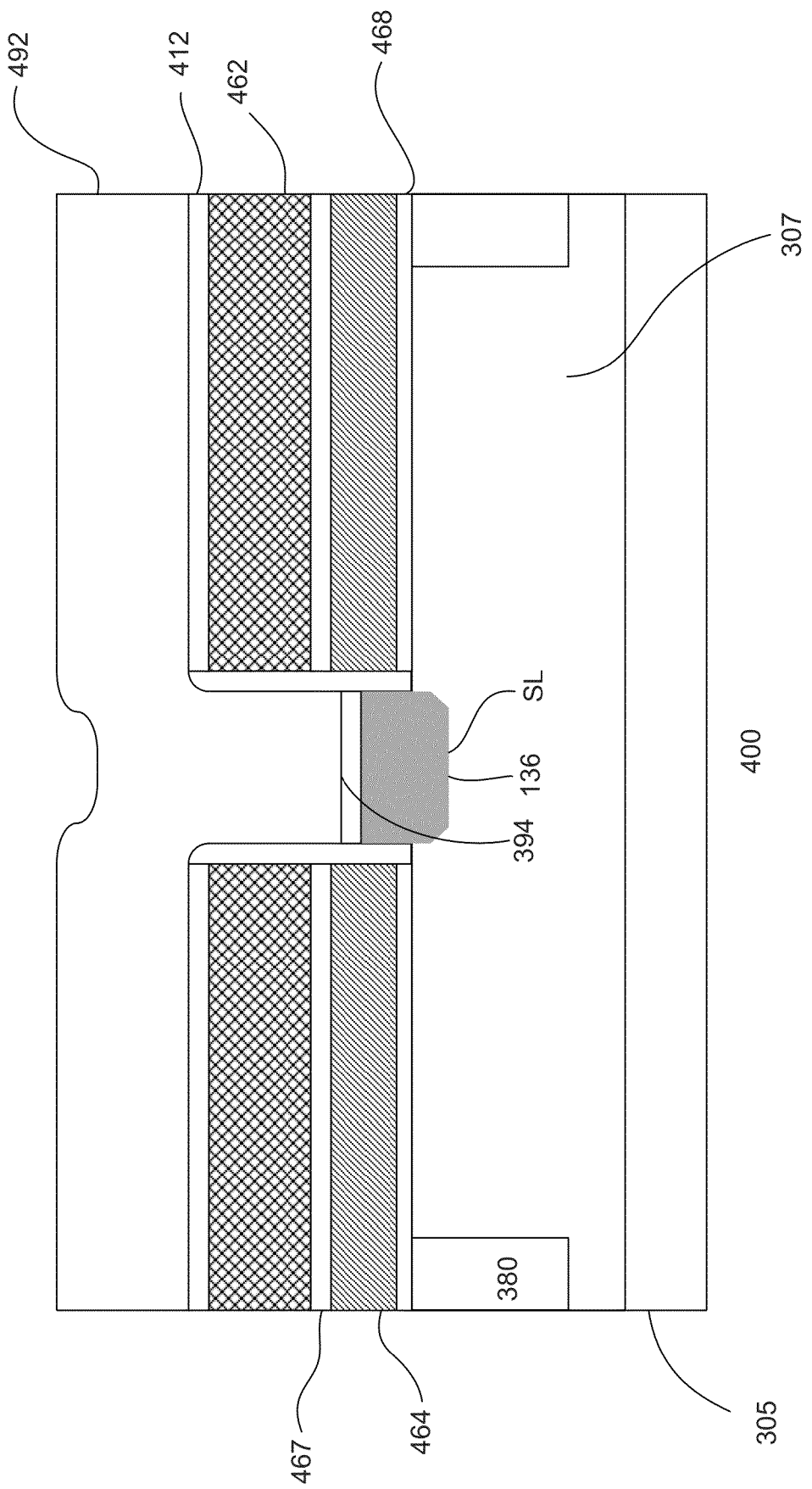

In FIG. 4d, the spacer layer is patterned to form spacers 459 on sidewalls of the opening in the gate layered stack. Patterning, for example, may be an anisotropic etch, such as a RIE. The etch removes horizontal portions of the spacer layer, leaving spacers on sidewalls of the opening. The spacers 459 are used for erase operation and isolation purposes.

A raised source line 436 is formed in the opening. In one embodiment, a semiconductor layer is formed in the opening. The semiconductor layer serves as at least an elevated portion of the raised source line. The semiconductor layer may be, for example, a silicon layer. Other types of semiconductor layer may also be useful. For example, the semiconductor layer may be a silicon-based on non-silicon based layer. In one embodiment, the semiconductor layer is an epitaxial semiconductor layer. The epitaxial layer may be formed of a desired height or thickness of the raised source line. The desired height of the semiconductor layer should be lower than the top of the first electrode layer. The desired height of the semiconductor layer, for example, is about 30 to 40 nm. Other suitable dimensions may also be useful.

Alternatively, the semiconductor layer is a polycrystalline or crystallized amorphous semiconductor layer. In such case, the semiconductor layer may be formed by depositing a fill semiconductor layer over the substrate, filling the opening and covering the surface of the gate layered stack. A polishing process may be performed to planarize the substrate, leaving a coplanar surface with the semiconductor layer in the opening, spacers, and top of the gate stack. The planarizing process, for example, is a chemical mechanical polishing (CMP) process. The fill semiconductor material in the opening is recessed to a desired height, forming the semiconductor layer in the opening which serves as the raised source line. The raised source line is isolated from the gate layered stack by the dielectric spacers. The recessing of the semiconductor layer may be achieved by an etch back, such as an anisotropic etch. For example, a RIE selective to the hard mask may be performed to recess the semiconductor layer to form the raised source line. Other suitable techniques, such as wet etch, may also be employed.

In the case that the fill semiconductor layer is a polycrystalline layer, the semiconductor layer is a polycrystalline semiconductor layer. In the case that the fill semiconductor layer is an amorphous semiconductor layer, an anneal is performed to crystallize the amorphous semiconductor layer. In one embodiment, the anneal may be laser spike anneal. Other suitable annealing techniques may also be employed. The anneal, for example, may be conducted together with dopant activation anneal at later processing.

The process continues to form a second doped region 136. In one embodiment, the second doped region is formed by implanting first polarity type dopants into the raised source line 436 and substrate below. The hard mask, for example, serves as an implant mask, protecting the gate stack layers. For example, dopants are implanted into the semiconductor layer 436 and substrate below. The second doped region is heavily doped with first polarity type dopants. A height of the second doped region or source line may be about 20 nm for a FG with a thickness of about 80 nm. Other height dimensions may also be useful, depending on technology node. After forming the second doped region 136, an EG dielectric 394 is formed in the opening over the second doped region. The EG dielectric may be, for example, silicon oxide having a thickness of about 20 nm. Other types of dielectric layer or thicknesses may also be useful. The EG dielectric may be formed by thermal oxidation. Forming the EG dielectric using other techniques may also be useful.

A third gate electrode layer 492 is formed on the substrate, filling the opening and covering the gate stack layers. The third gate electrode layer may be a semiconductor layer, such as polysilicon. The third gate electrode layer can be formed as an amorphous or non-amorphous layer. In one embodiment, the third gate electrode is doped, for example, with first polarity type dopants. Various techniques may be employed to dope the gate electrode, for example, in situ doping or ion implantation. In one embodiment, the third gate electrode is in situ doped with first polarity type dopants. Providing an undoped gate electrode layer may also be useful. Other types of gate electrode materials are also useful. For example, Si—Ge, Ge or metal may be used as the gate electrode material. To form the third gate electrode layer, techniques such as CVD, can be used. Other techniques and suitable materials for forming the layer may also be useful. The third gate electrode layer may be employed to form, for example, the EG.

Figure 4F:
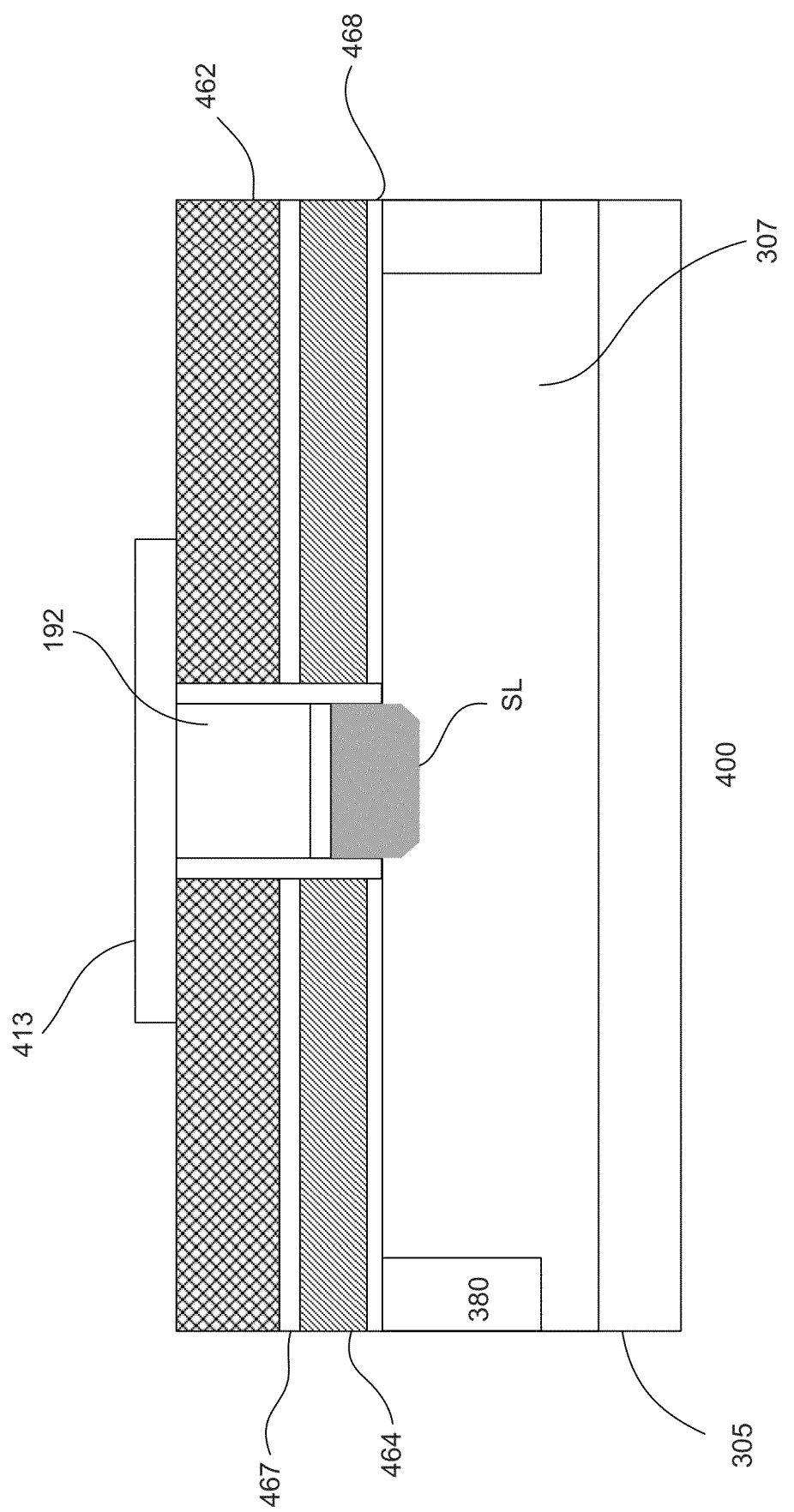

Excess third gate electrode material over the gate stack is removed to provide a planar substrate top surface, as shown in FIG. 4f. Removing the excess third gate electrode material, in one embodiment, is achieved using a planarizing process, such as CMP. The hard mask 412, for example, may serve as an etch stop. In one embodiment, the planarizing process produces a planar surface between the second gate electrode layer and third gate electrode layer, including the spacers. Other types of removal processes, such as RIE, may also be useful. In such case, a non-planar surface between the second gate electrode layer and third gate electrode layer may be formed. The hard mask 412 may be removed using suitable techniques.

Figure 4G:
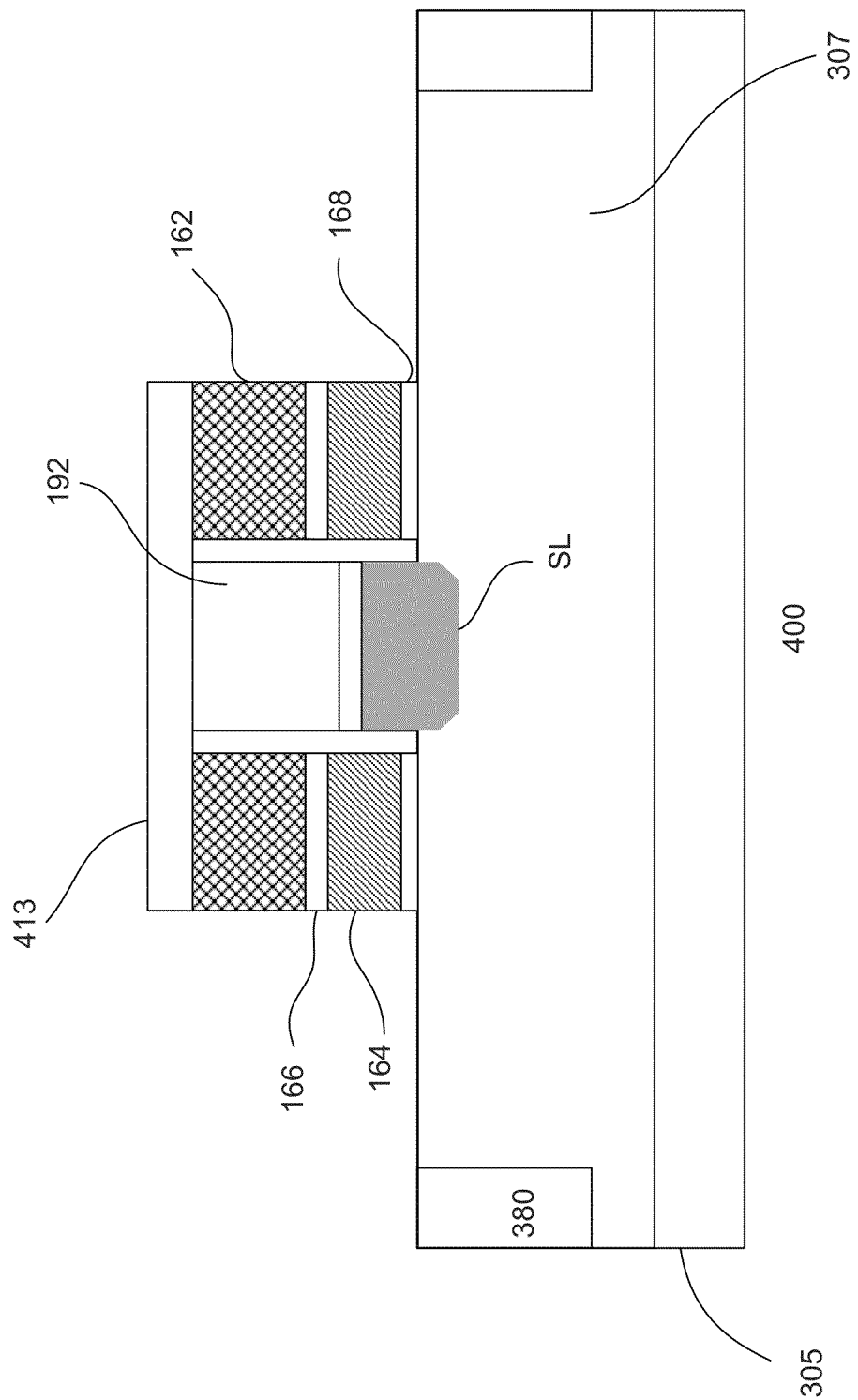

A patterned hard mask 413 is provided on the substrate. For example, the patterned hard mask is provided on the top of the gate stack layer and third gate electrode layer. The patterned hard mask exposes portion of the substrate to be removed. For example, portions of the gate stack layer to be removed are exposed by the patterned hard mask. The hard mask may be patterned by a soft mask, such as a photoresist. In FIG. 4g, the exposed portions of the gate stack layer are removed. For example, an anisotropic etch, such as RIE, removes exposed portions of the gate stack layer, exposing the substrate below. The etch forms second gates 142 adjacent to the second doped region. For example, second gates of the memory cell pair are formed. The hard mask is removed after patterning the gate stack.

Figure 4H:
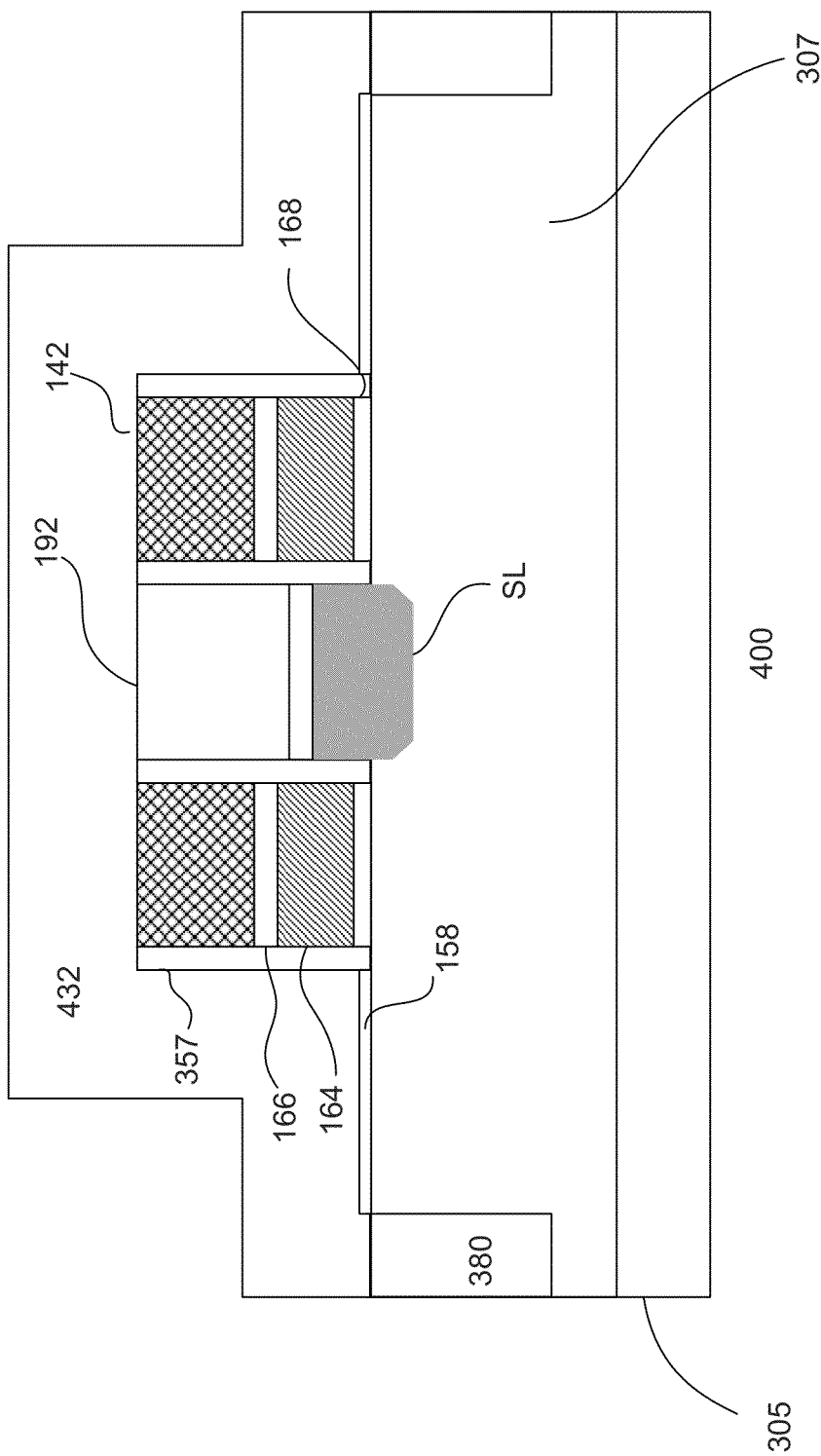

Referring to FIG. 4h, dielectric spacers 357 are formed on the exposed sidewalls of the second gates. To form the dielectric spacer, a dielectric spacer layer, such as silicon oxide, is formed on the substrate, lining the substrate and gate. Other dielectric materials, such as SiON or $SiO_2/SiN$, may also be useful. The dielectric spacer layer may be formed by, for example, CVD. Other techniques may also be useful. An anisotropic etch is performed, removing horizontal portions of the spacer layer, leaving spacers on exposed sidewalls of the second gates.

After forming the dielectric spacers, an access gate dielectric layer 158 is formed. The access gate dielectric layer, for example, is silicon oxide. The access gate dielectric layer may be formed by thermal oxidation. Other types of forming techniques for the access gate dielectric layer may also be useful. The thickness of the access gate dielectric layer, for example, may be about 20 to 80 Å. In one embodiment, the thickness of the access gate dielectric layer is about 24 Å. Other thicknesses may also be useful.

A fourth gate electrode layer 432 is formed on the substrate. The electrode layer covers exposed substrate and second gates. The electrode layer, for example, is a semiconductor layer, such as polysilicon. The fourth gate electrode layer can be formed as an amorphous or non-amorphous layer. In one embodiment, the fourth gate electrode layer is doped, for example, with first polarity type dopants. Various techniques may be employed to dope the gate electrode, for example, in situ doping or ion implantation. Providing an undoped gate electrode layer may also be useful. Other types of gate electrode materials are also useful. For example, Si—Ge, Ge or metal may be used as the fourth gate electrode material. The thickness of the fourth gate electrode layer may be about 30 nm. Other thicknesses are also useful. To form the fourth gate electrode layer, techniques, such as CVD, can be used. Other techniques are also useful. It is understood that the fourth gate electrode layer need not be the same as the first, second or third gate electrode layers. The fourth gate electrode layer may be employed to form, for example, the access gate.

Figure 4I:
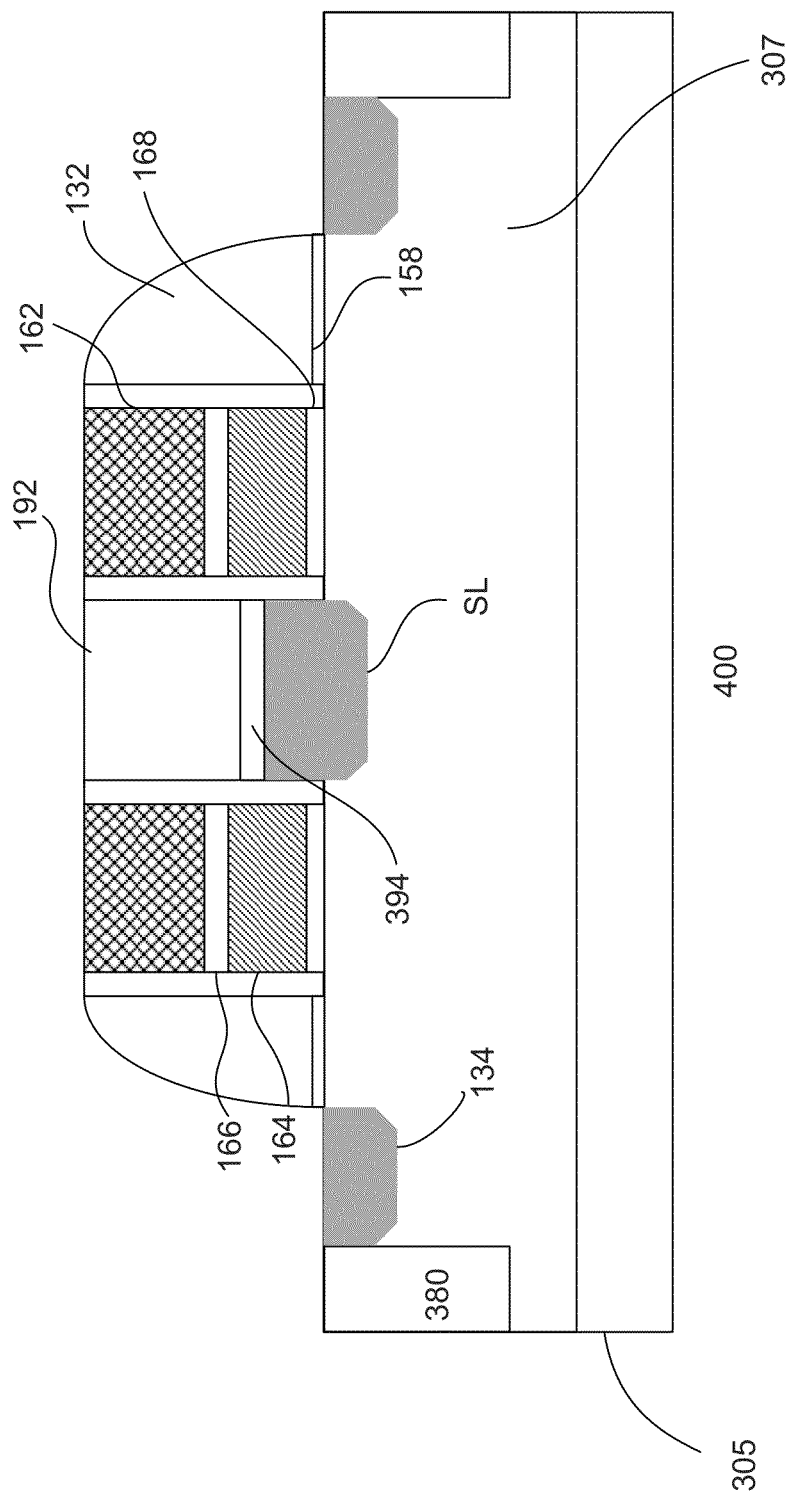

As shown in FIG. 4i, first gates 132 are formed. For example, access gates are formed. In one embodiment, first gates are formed by anisotropically etching the substrate. The etch removes horizontal portions of the fourth gate electrode layer, leaving spacers to serve as the first gates. The etch exposes the second and erase gates and substrate. For example, regions of the substrate where first terminals or first doped regions are to be formed are exposed. An implant is performed to form the first doped regions in the substrate. The first doped regions 134 serve as bit line terminals. The implant includes first polarity type dopants. The implant forms heavily doped first polarity type doped regions in the substrate adjacent to the access gates. In one embodiment, the bottoms of the first doped regions 134 are deeper than the bottom of second doped region or source line 136. The depth of the first doped regions, for example, may include any suitable depth dimensions, depending on technology node. An anneal may then be performed to activate the dopants of various regions and layers.

The process continues to complete forming the substrate. For example, a dielectric layer (not shown) may be disposed over the transistor. The dielectric layer may be a silicon oxide layer. Other types of dielectric layers may also be useful. The dielectric layer may serve as a pre-metal dielectric (PMD) layer or contact level CA. Contacts may be provided to the different terminals of the memory cell pair. A metal level, such as M1, may be disposed over the CA level. The metal level includes metal lines formed in a dielectric layer. Inter-level dielectrics (ILDs) may be provided over the metal level. An ILD includes a via and metal level for providing interconnections, as desired. For example, BLs may be provided in M1 while SLs, WLs, EGLs and CGLs are provided in M2. Other configurations may also be useful. Additional processing may be performed to complete forming the device. For example, additional processing may include passivation, dicing and packaging may be performed. Other processes may also be included.

Figure 5A:
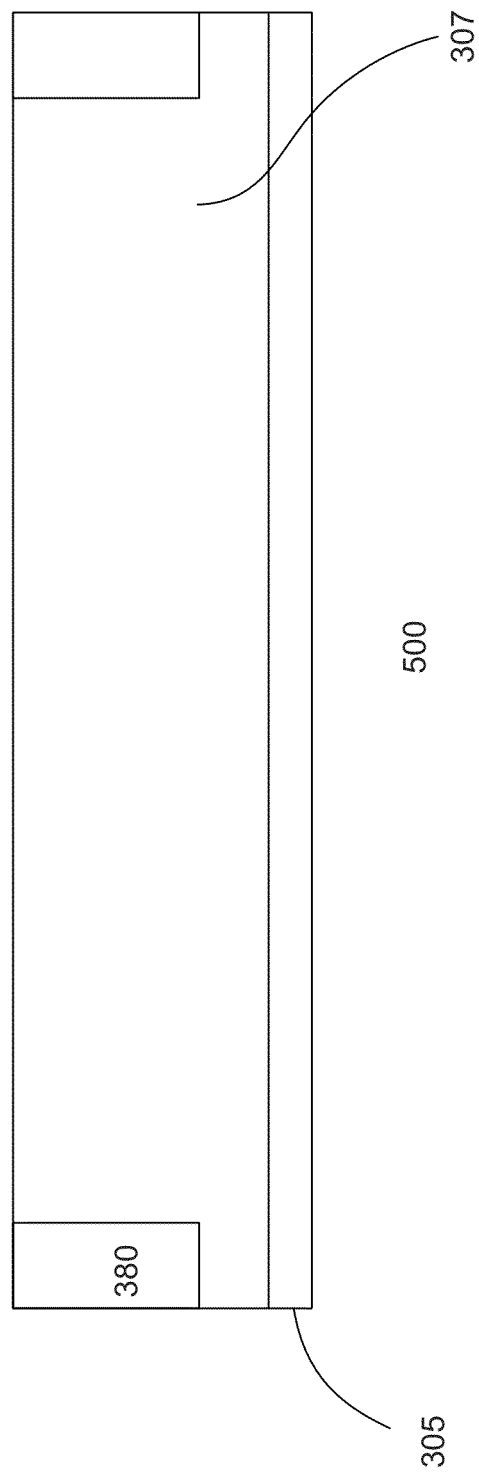
FIGS. 5a-5j show cross-sectional views of another embodiment of a process for forming a memory cell.

FIGS. 5a-5j show cross-sectional views of another embodiment of a process 500 for forming a device. The device, for example, is similar to that described in FIGS. 1b and 3b while the process is similar to that described in FIGS. 4a-4i. Common elements may not be described or described in detail. Referring to FIG. 5a, a substrate 305 is provided. The substrate, for example, may be a silicon substrate. The substrate can be lightly doped with p-type dopants. Other types of semiconductor substrates may also be used. For example, the substrate may be silicon germanium or silicon-on-insulator (SOI) as well as intrinsic or doped with other types of dopants or dopant concentrations. The substrate, for example, is at the stage of processing as described in FIG. 4a.

Figure 5B:
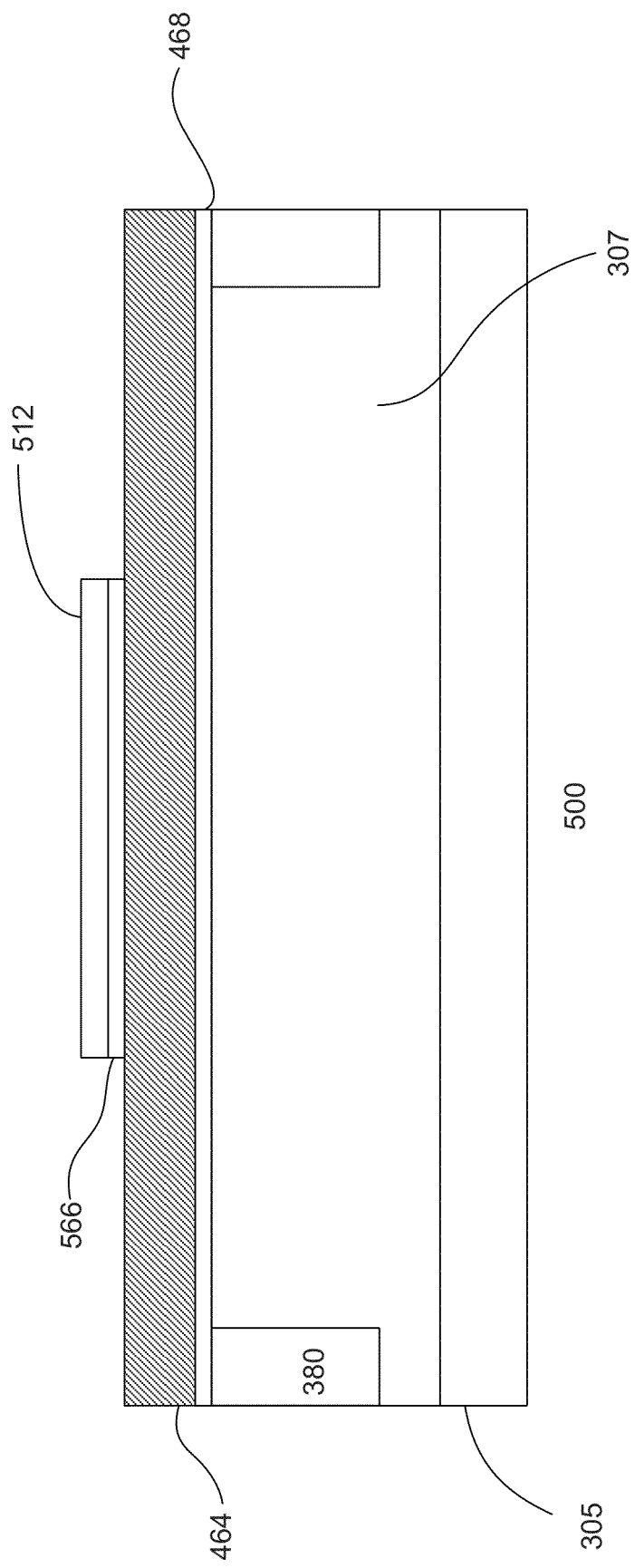

Referring to FIG. 5b, the substrate is prepared with a primary gate dielectric layer 468. In one embodiment, the gate dielectric layer may be a silicon oxide layer. The silicon oxide layer may be formed by thermal oxidation. Other types of gate dielectric layers or forming techniques may also be useful.

A first gate electrode layer 464 is formed on the primary gate dielectric layer. The first gate electrode layer is a semiconductor layer. For example, the first gate electrode layer may be polysilicon. The gate electrode layer may be formed by CVD. Other types of gate electrode layers or forming techniques may also be useful. The first gate electrode layer may be employed to form, for example, the FG as well as part of the AG.

A CG dielectric layer 566 is formed on the first gate electrode layer. The CG dielectric layer may be a part of an intergate dielectric layer. In one embodiment, the CG dielectric layer may be silicon oxide. Other types of dielectric material, such as silicon oxynitride, $Si_3N_4$, high-k dielectrics may also be useful. In other embodiments, the CG dielectric layer includes a dielectric stack. For example, the CG dielectric layer includes multiple dielectric layers. The intergate dielectric layer, in one embodiment, includes an ONO stack. The intergate dielectric layer may be formed by thermal oxidation or CVD. Other types of dielectric layers or techniques for forming the CG dielectric layer may also be useful. The thickness of the CG dielectric layer, for example, may be about 8 to 30 nm. In one embodiment, the CG dielectric layer is about 15 nm thick. Other thicknesses may also be useful.

In one embodiment, the CG dielectric layer is patterned. Patterning the CG dielectric layer may be achieved by employing a patterned mask 512. The mask, for example, is a resist mask. Other types of masks may also be useful. The patterned mask exposes the portion of the CG dielectric layer to be removed. In one embodiment, the patterned mask protects the CG dielectric layer where second gates are formed. Removing the exposed CG dielectric layer may be achieved with an anisotropic etch, such as RIE. Other types of etches may also be useful. The patterned mask 512 may be removed using any suitable techniques.

A second gate electrode layer 462 is formed on the substrate, covering the first electrode and CG dielectric layers. The second gate electrode layer, in one embodiment, is a semiconductor layer, such as polysilicon. The gate electrode layer may be formed by CVD. Other types of gate electrode layers or forming techniques may also be useful. The second gate electrode layer may be employed to form, for example, the CG as well as part of the access gate. The various layers form a gate layered stack.

Figure 5C:
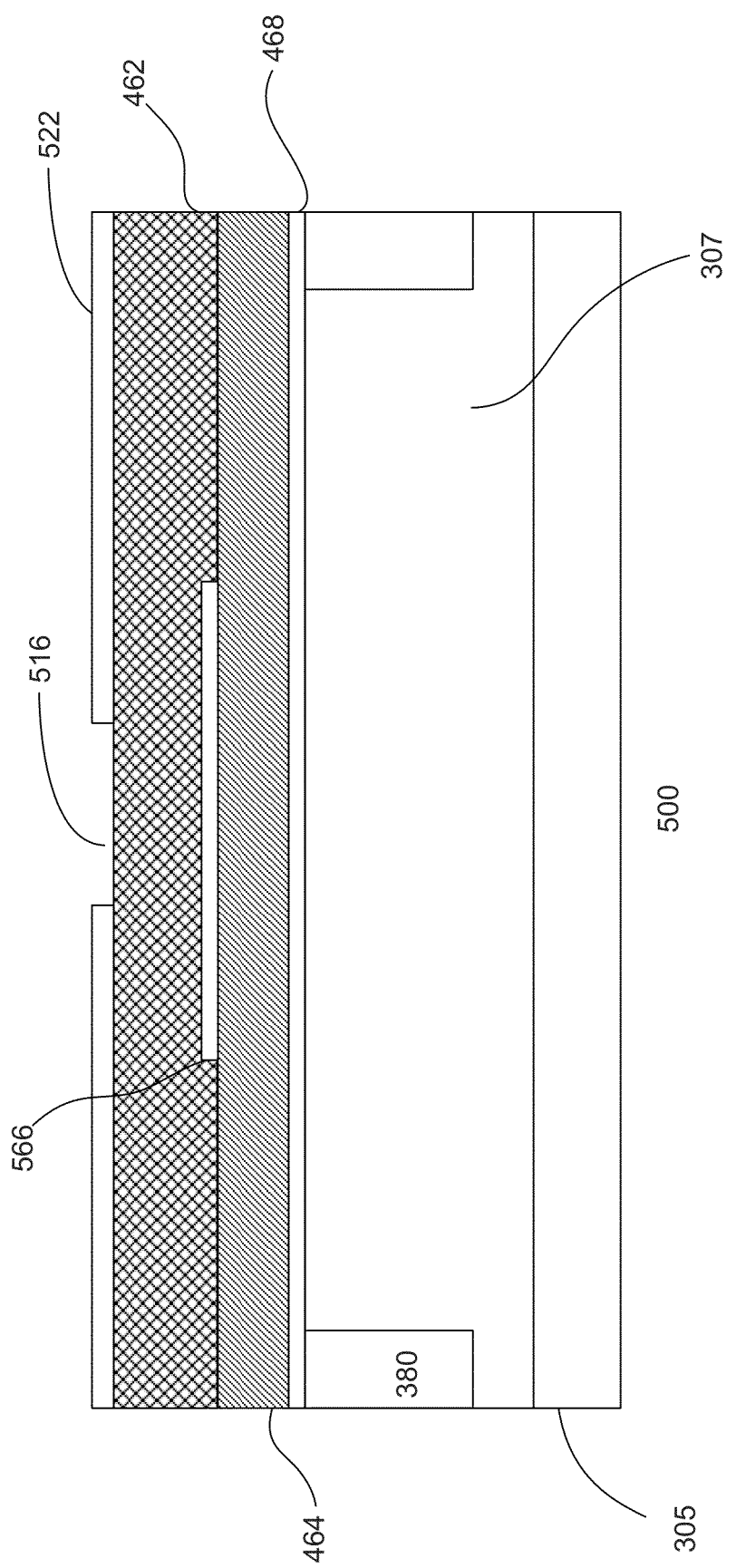

The process continues to form a raised source line. Referring to FIG. 5c, a mask 522 is formed on the gate layered stack. The mask, for example, is a hard mask. The hard mask may be a silicon nitride hard mask. Other types of hard mask may also be useful. For example, the hard mask may be formed of a material which can etch the gate stack selectively. The hard mask is patterned to expose the gate stack. For example, the hard mask is patterned, forming an opening 516 to expose the gate stack where source line is to be formed.

Figure 5D:
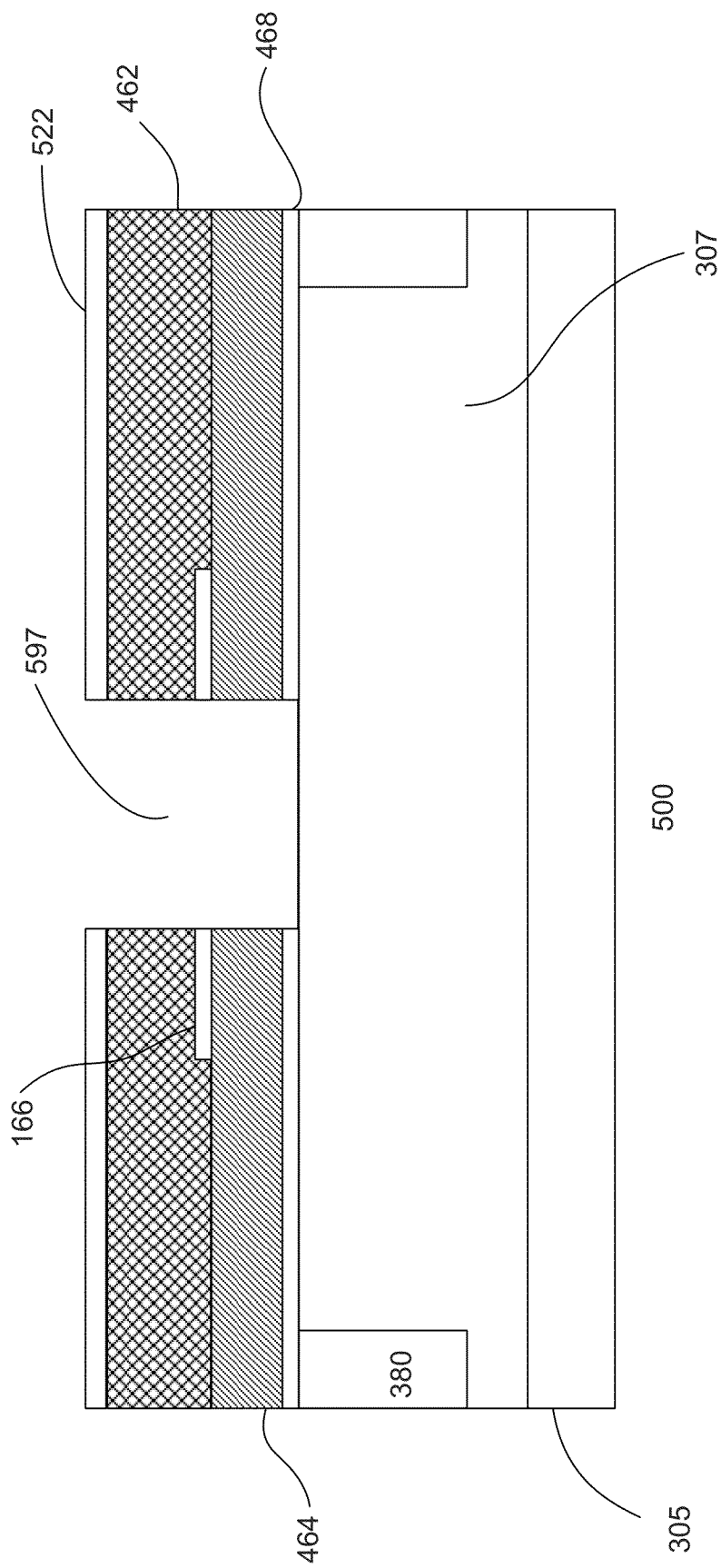

As shown in FIG. 5d, the gate layered stack is patterned. For example, the portion of the gate layered stack exposed by the hard mask is removed. In one embodiment, an anisotropic etch, such as RIE, is performed to pattern the gate layered stack, forming an opening 597 to expose the substrate corresponding to the source line. The opening, in one embodiment, at least exposes the substrate. To ensure that the substrate is exposed, an over etch may be performed. Other techniques for patterning the gate layered stack may also be useful.

Figure 5E:
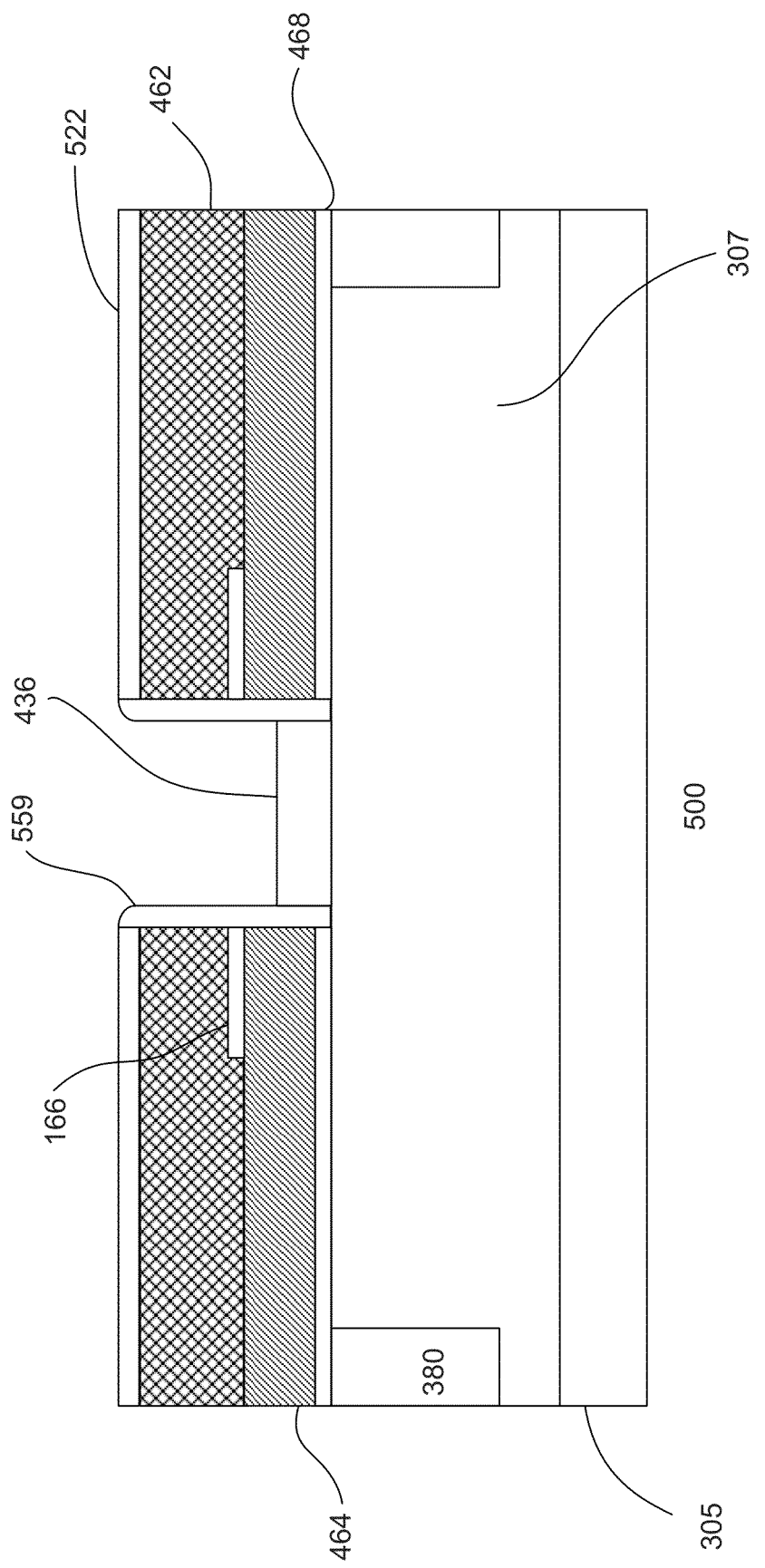
Figure 5F:
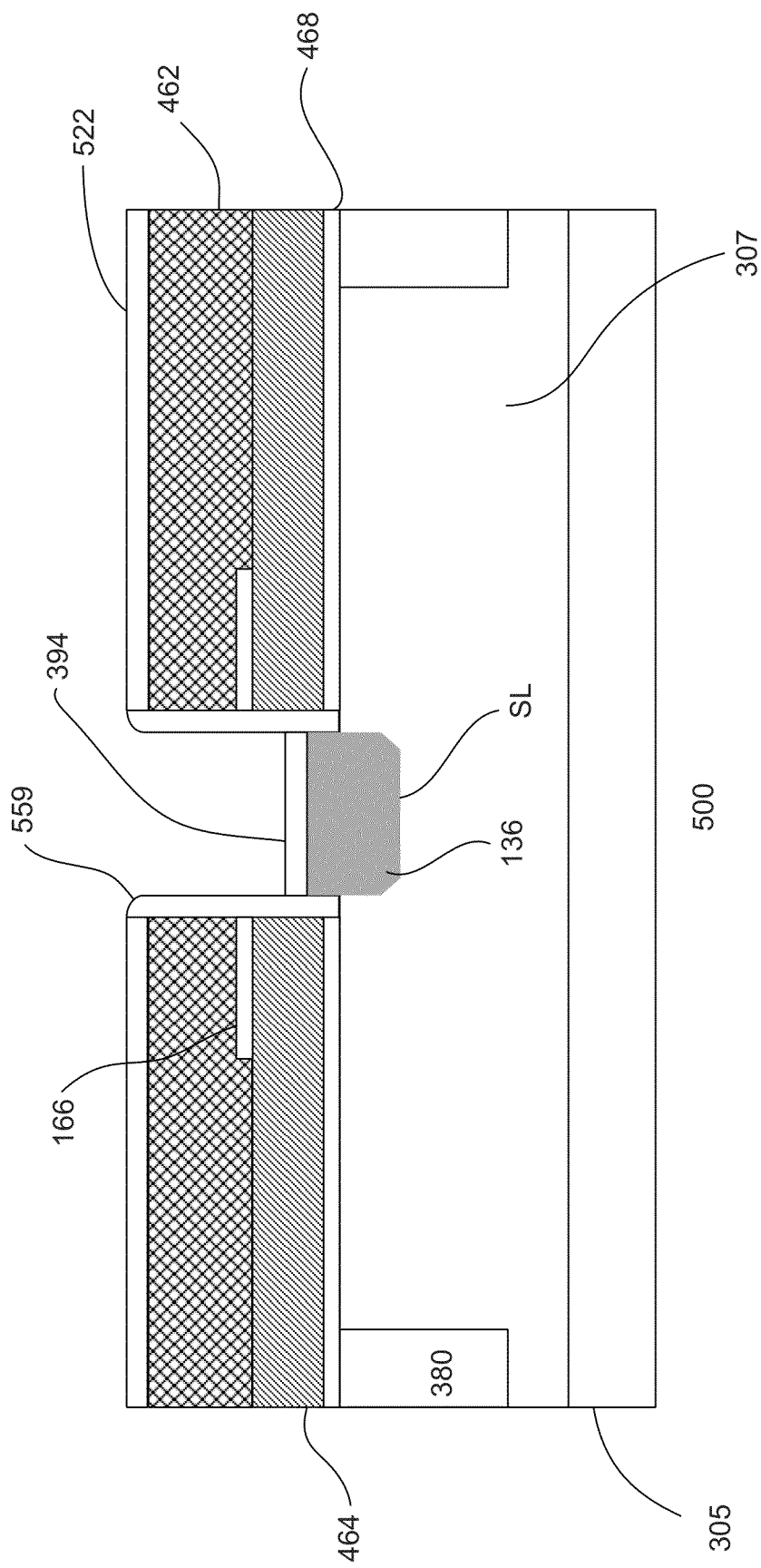

In FIG. 5e, the process continues to form dielectric spacers 559 on sidewalls of the opening in the gate layered stack. A raised source line 436 is formed in the opening. The spacers and raised source line is formed, as described in, for example, FIG. 4d. After forming the raised source line, the process continues to form a second doped region 136 by implanting first polarity type dopants into the raised source line 436 and the substrate below. The second doped region serves as a second cell terminal or source line terminal. As shown in FIG. 5f, an EG dielectric 394 is formed in the opening over the second doped region. The EG dielectric may be, for example, silicon oxide. The processes for forming the second doped region and EG dielectric are similar to that described in FIG. 4e.

Figure 5G:
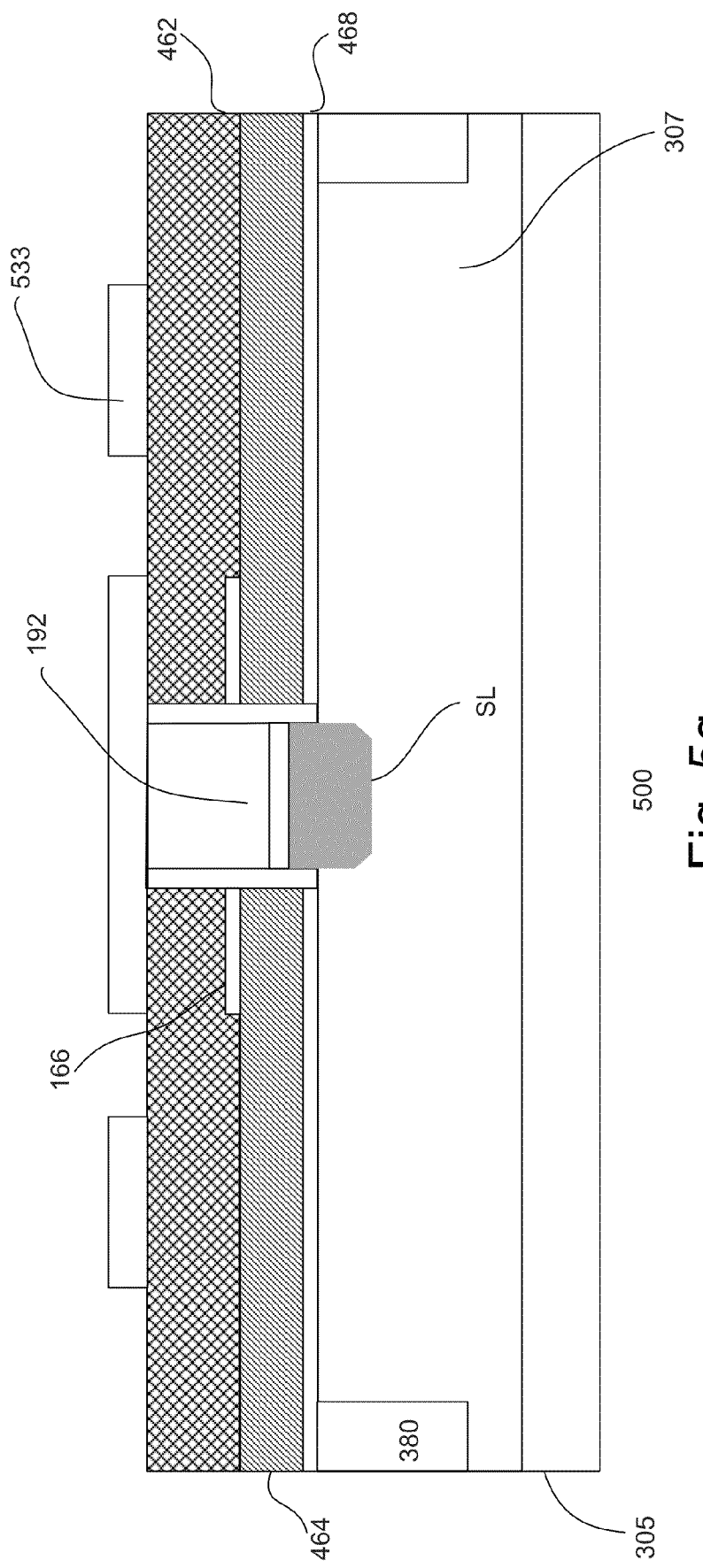

Referring to FIG. 5g, a third gate electrode layer is formed on the substrate, filling the opening and covering the gate stack layers. The third gate electrode layer may be a semiconductor layer, such as polysilicon. The process of forming the third gate electrode layer is similar to that described in FIG. 4e. Excess third gate electrode material over the gate stack is removed by, for example, a planarizing process, such as CMP, to provide an EG 192 having a planar substrate top surface. In one embodiment, the planarizing process produces a planar surface between the second gate electrode layer and third gate electrode layer, including the spacers. The planarizing process may be similar to that described in, for example, FIG. 4f.

A patterned hard mask 533 is provided on the substrate. For example, the patterned hard mask is provided on the top of the gate stack layer and third gate electrode layer. The patterned hard mask exposes portions of the substrate to be removed. For example, portions of the gate stack layer to be removed are exposed by the patterned hard mask. The hard mask may be patterned by a soft mask, such as a photoresist.

Figure 5H:
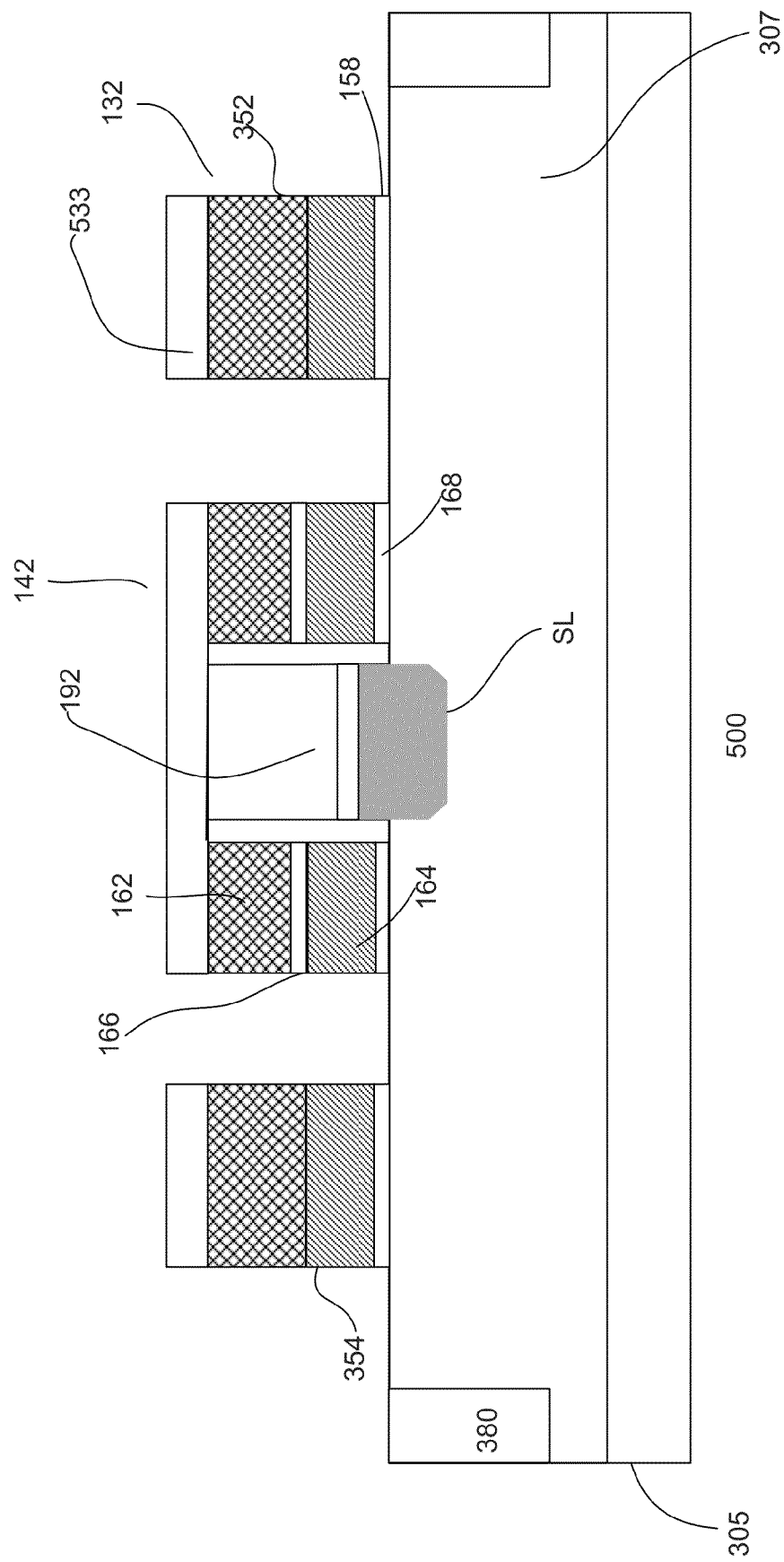

In FIG. 5h, the exposed portions of the gate stack layer are removed. For example, an anisotropic etch, such as RIE, removes exposed portions of the gate stack layer, exposing the substrate below. The etch forms first and second gates 132 and 142. The second gate is adjacent to the second cell terminal. For example, second gates of the memory cell pair are adjacent to the second cell terminal or source line terminal. The first gates are distinct or separated from the second gates. A second gate serves as a storage gate, having a CG and FG separated by CG dielectric. As for a first gate, it serves as an access gate. The access gate includes first and second gate electrode layers 352 and 354 in contact with each other.

The gates are first and second transistors of a memory cell. Substrate regions adjacent to the gates are exposed. The substrate regions correspond to access terminals as well as first storage terminals.

Figure 5I:
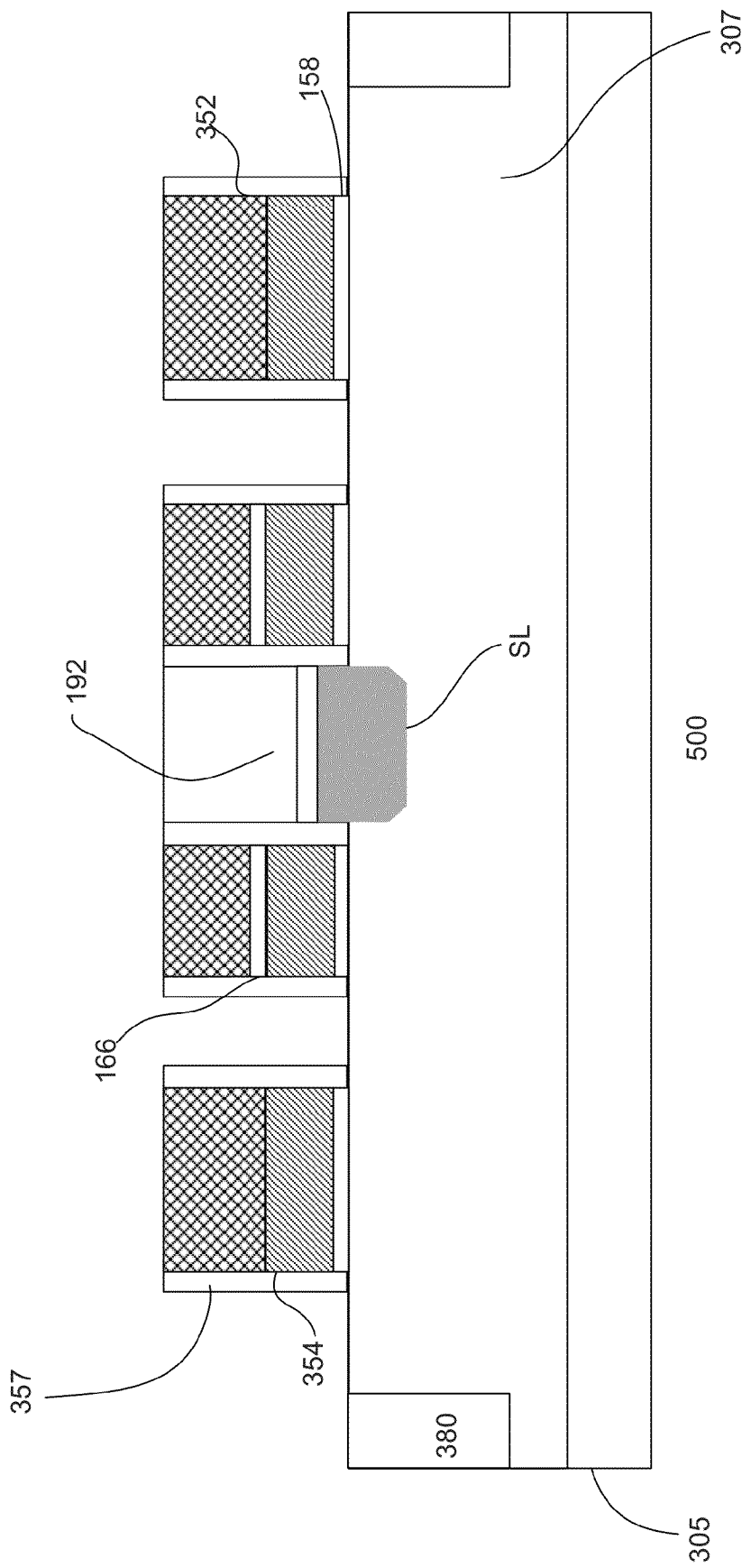

Referring to FIG. 5i, the hard mask 533 is removed after patterning the gate layered stack to form the gates. The hard mask is removed by, for example, a wet etch. Other techniques for removing the hard mask may also be useful. Dielectric spacers 357 are formed on the exposed sidewalls of the gates. To form the dielectric spacers, a dielectric spacer layer, such as silicon oxide, is formed on the substrate, lining the substrate and gate. Other dielectric materials, such as SiON or SiO$_2$/SiN, may also be useful. The dielectric spacer layer may be formed by, for example, CVD. Other techniques may also be useful. An anisotropic etch is performed, removing horizontal portions of the spacer layer, leaving spacers on exposed sidewalls of the gates.

Figure 5J:
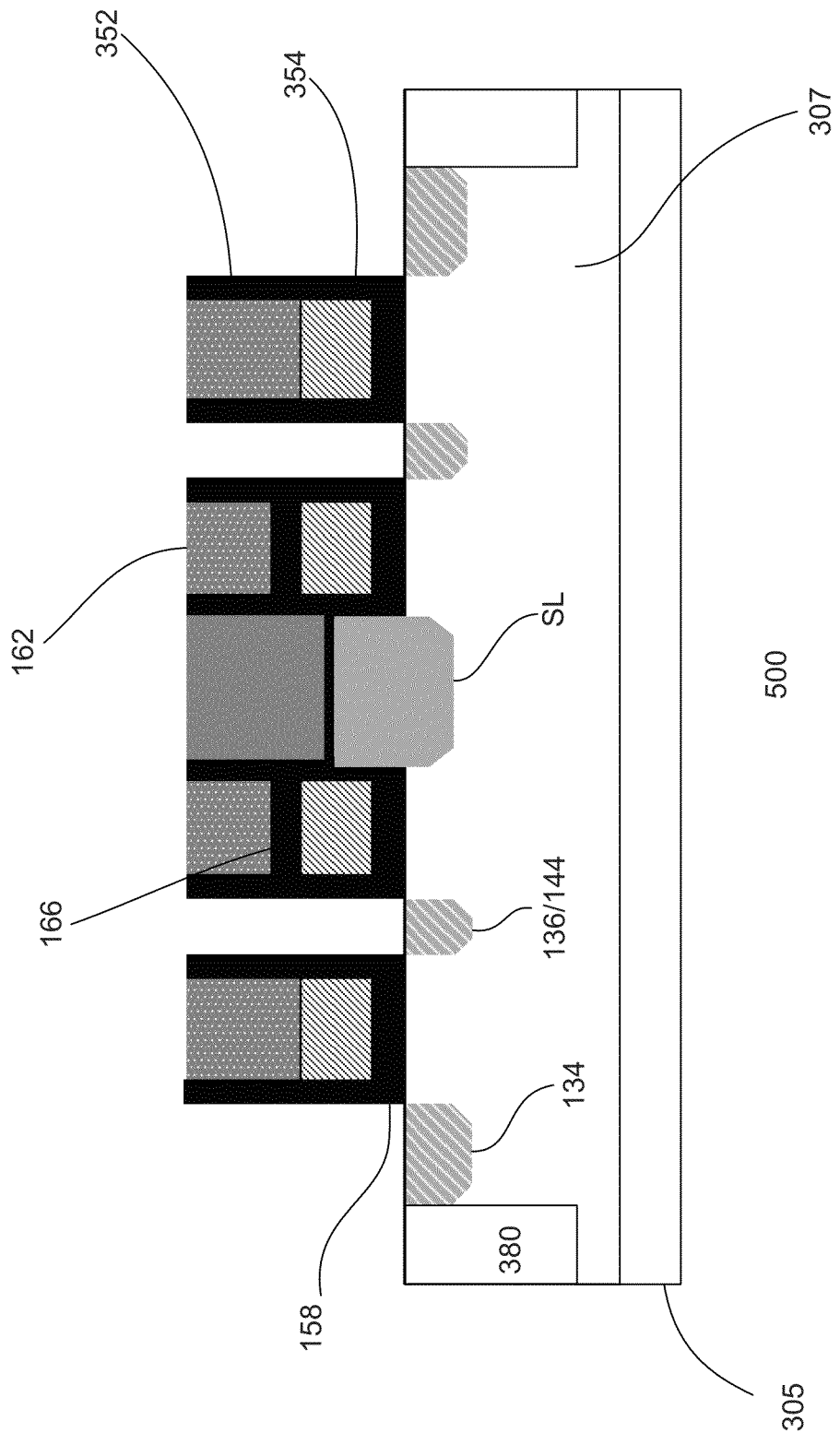

In FIG. 5j, an implant is performed for doped regions of the transistors in exposed regions of the substrate. For example, first cell terminals 134 of the first transistors and common first and second terminals of first and second transistors are formed. The first cell terminals 134, for example, serve as bit line terminals or doped regions. The implant, for example, is similar to that described in FIG. 4i.

The process continues to complete forming the substrate. For example, a dielectric layer (not shown) may be disposed over the transistor. The dielectric layer may be a silicon oxide layer. Other types of dielectric layers may also be useful. The dielectric layer may serve as a pre-metal dielectric (PMD) layer or contact level CA. Contacts may be provided to the different terminals of the memory cell pair. A metal level, such as M1, may be disposed over the CA level. The metal level includes metal lines formed in a dielectric layer. Inter-level dielectrics (ILDs) may be provided over the metal level. An ILD includes a via and metal level for providing interconnections, as desired. For example, BLs may be provided in M1 while SLs, WLs, EGLs and CGLs are provided in M2. Other configurations may also be useful. Additional processing may be performed to complete forming the device. For example, additional processing may include passivation, dicing and packaging may be performed. Other processes may also be included.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
    providing a substrate prepared with a cell region; and
    forming first and second memory cells of a memory cell pair in the cell region, wherein forming the memory cell pair comprises
        forming first and second storage gates (SGs) of the first and second memory cells, wherein a SG includes a primary gate dielectric layer, a floating gate (FG) electrode layer, a control gate (CG) dielectric layer and a CG electrode layer,
        forming an elevated source line terminal between the SGs of the memory cell pair, the elevated source line having a top surface extending above a top surface of the substrate and below a top of the FG electrode layer, forming an erase gate (EG) over the elevated source line, the erase gate is isolated from first sidewalls of the SGs and source line terminal, forming first and second access gates (AGs) adjacent to the SGs, and forming first and second bitline terminals adjacent to the first and second AGs.

2. The method of claim 1 wherein forming the first and second SGs of the first and second memory cells comprises:

forming a SG stack on the substrate, wherein forming the SG stack includes forming a primary gate dielectric layer over the substrate, forming a FG electrode layer over the primary gate dielectric layer, forming a CG dielectric layer over the FG electrode layer, and forming a CG electrode layer over the CG dielectric layer;

performing a first patterning of the SG stack to form a source line opening, the source line opening exposes the substrate related to the source line and the first sidewalls of the first and second SGs;

forming the elevated source line in the source line opening;

forming the EG over the elevated source line; and performing a second patterning of the SG stack to form the first and second SGs.

3. The method of claim 2 wherein forming the elevated source line comprises epitaxially growing a semiconductor layer in the source line opening to a desired height which is lower than a top surface of the FG electrode layer to form the elevated source line terminal, wherein an EG opening remains over the elevated source line.

4. A method for forming a device comprising:

providing a substrate prepared with a cell region; and forming first and second memory cells of a memory cell pair, wherein forming the memory cell pair comprises forming a storage gate (SG) stack on the substrate, the SG stack includes a primary gate dielectric layer, a floating gate (FG) electrode layer, a control gate (CG) dielectric layer and a CG electrode layer, performing a first patterning of the SG stack comprising forming a first patterned hard mask having a hard mask opening which exposes the SG stack where a source line terminal is to be formed, removing portion of the SG stack exposed by the hard mask opening to form a source line opening which exposes the substrate and first sidewalls of the SG stack, forming erase gate (EG) spacers on the first sidewalls of the SG stack, forming an elevated source line terminal in the source line opening, the elevated source line having a top surface extending above a top surface of the substrate, forming an EG over the elevated source line, the EG is isolated from the elevated source line by an EG dielectric layer over the elevated source line, performing a second patterning of the SG stack to form first and second storage gates (SGs) with the EG and elevated source line between the first sidewalls, forming first and second access gates (AGs) on exposed second sidewalls of the SGs, the AGs are isolated from the SGs and the top surface of the substrate, and forming first and second bitline terminals adjacent to the first and second AGs.

5. The method of claim 4 wherein forming the elevated source line terminal comprises forming a semiconductor layer in the opening by an epitaxial process to a desired height which is lower than a top surface of the FG electrode layer to form the elevated source line terminal, wherein an EG opening remains over the elevated source line.

6. The method of claim 5 comprising implanting first polarity type dopants into the elevated source line terminal and the substrate below to form a heavily doped first polarity type elevated source line terminal.

7. The method of claim 6 wherein forming the EG comprises:

depositing an erase gate electrode layer over the substrate to fill the EG opening over the elevated source line terminal; and planarizing the substrate to provide a planar surface with the EG and the SG stack.

8. The method of claim 7 wherein performing the second patterning of the SG stack comprises:

providing a second patterned hard mask on the substrate; and patterning the SG stack to form the first and second SGs of the memory cell pair.

9. The method of claim 8 wherein:

forming the first and second AGs comprises forming dielectric spacers over the exposed second sidewalls of the first and second SGs, forming an AG electrode layer over the substrate and covering the first and second SGs and EG, and removing horizontal portions of the AG electrode layer to form the first and second AGs; and forming the first and second bitline terminals comprises implanting first polarity type dopants into portions of the substrate adjacent to the AGs to form heavily doped first and second bitline terminals.

10. The method of claim 4 wherein forming the elevated source line terminal comprises:

depositing a fill semiconductor layer over the substrate to fill the source line opening and covering a top surface of the SG stack;

planarizing the fill semiconductor layer to form a planar surface between the SG stack and fill semiconductor layer; and recessing the fill semiconductor layer in the source line opening to a desired height which is lower than a top surface of the FG gate electrode layer to form the elevated source line terminal, wherein an EG opening remains over the elevated source line.

11. The method of claim 10 comprising implanting first polarity type dopants into the elevated source line terminal and the substrate below to form a heavily doped first polarity type elevated source line terminal.

12. The method of claim 11 wherein forming the EG comprises:

depositing an erase gate electrode layer over the substrate to fill the EG opening over the elevated source line terminal; and planarizing the substrate to provide a planar surface with the EG and the SG stack.

13. The method of claim 12 wherein performing the second patterning of the SG stack comprises:

providing a second patterned hard mask on the substrate; and patterning the SG stack to form the first and second SGs of the memory cell pair.

14. The method of claim 13 wherein:

forming the first and second AGs comprises forming dielectric spacers over the exposed second sidewalls of the first and second SGs, forming an AG electrode layer over the substrate and covering the first and second SGs and EG, and removing horizontal portions of the AG electrode layer to form the first and second AGs; and forming the first and second bitline terminals comprises implanting first polarity type dopants into portions of the substrate adjacent to the AGs to form heavily doped first and second bitline terminals.

15. The method of claim 3 wherein forming the EG comprises:

depositing an erase gate electrode layer over the substrate to fill the EG opening over the elevated source line terminal; and planarizing the substrate to provide a planar surface with the EG and the SG stack.

16. The method of claim 15 wherein forming the first and second AGs comprises:

forming dielectric spacers over second sidewalls of the first and second SGs;

forming an AG electrode layer over the substrate and covering the first and second SGs and EG; and removing horizontal portions of the AG electrode layer to form the first and second AGs, wherein the AGs are formed on second sidewalls of the SGs, the AGs are isolated from the SGs and top surface of the substrate.

17. The method of claim 16 wherein forming the first and second bitline terminals comprises implanting first polarity type dopants into portions of the substrate adjacent to the AGs to form heavily doped first and second bitline terminals.

18. The method of claim 2 wherein forming the source line terminal comprises:

depositing a fill semiconductor layer over the substrate to fill the source line opening and covering top surface of the SG stack;

planarizing the fill semiconductor layer such that a coplanar surface is formed with the fill semiconductor layer in the opening, spacers and the top surface of the SG stack; and recessing the fill semiconductor layer to a desired height which is lower than a top surface of the FG electrode layer to form the elevated source line terminal.

19. The method of claim 1 wherein the bitline terminals comprise elevated bitline terminals to enhance short channel effect of the memory cell.

20. The method of claim 18 wherein:

forming the CG dielectric layer comprises patterning the CG dielectric layer to form a patterned CG dielectric layer over the FG electrode layer; and performing the second patterning of the SG stack to form the first and second SGs also forms the first and second AGs, wherein the AGs are displaced and separated from the SGs.

21. The method of claim 20 wherein the AG comprises the FG and CG electrode layers in contact with each other.

22. The method of claim 3 wherein:

forming the CG dielectric layer comprises patterning the CG dielectric layer to form a patterned CG dielectric layer over the FG electrode layer; and performing the second patterning of the SG stack to form the first and second SGs also forms the first and second AGs, wherein the AGs are displaced and separated from the SGs.

23. A method for forming a device comprising:

providing a substrate prepared with a cell region; and forming first and second memory cells of a memory cell pair, wherein forming the memory cell pair comprises forming a SG stack on the substrate, wherein the SG stack includes a primary gate dielectric layer over the substrate, a floating gate (FG) electrode layer over the primary gate dielectric layer, a control gate (CG) dielectric layer over the first gate electrode layer, and a CG electrode layer over the CG dielectric layer;

performing a first patterning of the SG stack to form a source line opening, the source line opening exposes the substrate related to a source line and exposing first sidewalls of the first and second SGs;

forming an elevated source line and an erase gate (EG) in the source line opening;

performing a second patterning of the SG stack to form the first and second SGs;

forming first and second access gates (AGs) adjacent to the SGs; and forming first and second bitline terminals adjacent to the first and second AGs.

* * * * *